(12) United States Patent
Yang et al.

(10) Patent No.: US 11,088,198 B2
(45) Date of Patent: Aug. 10, 2021

(54) DISPLAY DEVICE AND MANUFACTURING METHOD OF DISPLAY DEVICE

(71) Applicant: Samsung Display Co., Ltd., Yongin-Si (KR)

(72) Inventors: Donghyun Yang, Seongnam-si (KR); Inkyung Yoo, Hwaseong-si (KR); Sungbae Ju, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 6 days.

(21) Appl. No.: 16/508,447

(22) Filed: Jul. 11, 2019

(65) Prior Publication Data

US 2020/0111832 A1 Apr. 9, 2020

(30) Foreign Application Priority Data

Oct. 8, 2018 (KR) .................. 10-2018-0120035

(51) Int. Cl.
| | |
|---|---|
| *H01L 27/15* | (2006.01) |
| *H01L 33/00* | (2010.01) |
| *H01L 33/44* | (2010.01) |
| *H01L 33/40* | (2010.01) |
| *H01L 33/60* | (2010.01) |
| *H01L 33/10* | (2010.01) |

(52) U.S. Cl.
CPC .......... *H01L 27/156* (2013.01); *H01L 33/005* (2013.01); *H01L 33/10* (2013.01); *H01L 33/405* (2013.01); *H01L 33/44* (2013.01); *H01L 33/60* (2013.01)

(58) Field of Classification Search
None
See application file for complete search history.

(56) References Cited

U.S. PATENT DOCUMENTS

| | | | |
|---|---|---|---|
| 2018/0012876 A1 | 1/2018 | Kim et al. | |
| 2018/0019369 A1* | 1/2018 | Cho | .............. H01L 25/0753 |
| 2018/0019426 A1 | 1/2018 | Im et al. | |
| 2018/0122298 A1* | 5/2018 | Lee | .............. G09G 3/3233 |

(Continued)

FOREIGN PATENT DOCUMENTS

| | | |
|---|---|---|
| KR | 10-0806803 B1 | 2/2008 |
| KR | 10-2018-0007025 A | 1/2018 |
| KR | 10-2018-0009015 A | 1/2018 |

*Primary Examiner* — Benjamin P Sandvik
(74) *Attorney, Agent, or Firm* — Lewis Roca Rothgerber Christie LLP

(57) ABSTRACT

Provided is a display device including a pixel circuit, a first insulation layer covering the pixel circuit, a first barrier disposed on the first insulation layer and extending in a first direction, a second barrier separated from the first barrier and extending in the first direction and spaced apart from the first barrier layer in a second direction substantially perpendicular to the first direction, a first electrode disposed on the first barrier and electrically connected to the pixel circuit, a second electrode disposed on the second barrier and separated from the first electrode, a second insulation layer disposed on the first electrode and the second electrode with a rubbing groove provided therein in the second direction, and a light emitting element aligned along the rubbing groove on the second insulation layer and electrically connected to the first electrode and the second electrode.

18 Claims, 18 Drawing Sheets

(56) References Cited

U.S. PATENT DOCUMENTS

| | | | |
|---|---|---|---|
| 2018/0122837 A1* | 5/2018 | Kang | H01L 33/38 |
| 2019/0066592 A1* | 2/2019 | Kim | H01L 27/1214 |
| 2020/0152835 A1* | 5/2020 | Ko | H01L 27/156 |
| 2020/0176656 A1* | 6/2020 | Bae | H01L 33/0095 |

\* cited by examiner

DISPLAY DEVICE AND MANUFACTURING METHOD OF DISPLAY DEVICE

CROSS-REFERENCE TO RELATED APPLICATIONS

This U.S. non-provisional patent application claims priority under 35 U.S.C. § 119 to Korean Patent Application No. 10-2018-0120035, filed on Oct. 8, 2018, the entire contents of which are hereby incorporated by reference.

BACKGROUND

The present disclosure herein relates to a display device having improved reliability, and a manufacturing method of the display device.

A display device may include a light emitting element. The light emitting element may be electrically connected to an electrode, and emit light according to a voltage applied to the electrode. The light emitting element may be directly formed on the electrode, or a light emitting element separately made from the electrode may be connected to the electrode. When the light emitting element is separately formed and then connected to the electrode, a process for aligning the light emitting element on the electrode is necessary. When the light emitting element is not aligned properly on the electrode, the light emitting element may not emit light.

SUMMARY

The present disclosure provides a display device having improved reliability, and a manufacturing method of the display device.

An exemplary embodiment of the inventive concept provides a display device including: a pixel circuit; a first insulation layer covering the pixel circuit; a first barrier disposed on the first insulation layer and extending in a first direction; a second barrier extending in the first direction and spaced apart from the first barrier in a second direction substantially perpendicular to the first direction; a first electrode disposed on the first barrier and electrically connected to the pixel circuit; a second electrode disposed on the second barrier and separated from the first electrode; a second insulation layer disposed on the first electrode and the second electrode with a rubbing groove provided therein in the second direction; and a light emitting element aligned along the rubbing groove on the second insulation layer and electrically connected to the first electrode and the second electrode, and disposed between the first barrier and the second barrier.

In an exemplary embodiment, the second insulation layer may be formed of a polyimide-based material.

In an exemplary embodiment, a width of the light emitting element may be smaller than or equal to a width of the rubbing groove in the first direction.

In an exemplary embodiment, a distance between the first barrier and the second barrier may be larger than a distance between the first electrode and the second electrode in the second direction.

In an exemplary embodiment, a distance between the first electrode and the second electrode in the second direction may be smaller than a length of the light emitting element in the second direction.

In an exemplary embodiment, the second insulation layer may be disposed on the first electrode, the first insulation layer, and the second electrode at least between the first and second barriers.

The display device may further include: a first connection electrode electrically connecting the first electrode and the light emitting element; and a second connection electrode electrically connecting the second electrode and the light emitting element.

In an exemplary embodiment, the first electrode may include a first reflective electrode electrically connected to the pixel circuit and including a first reflective material, and a first capping electrode covering the first reflective electrode, and the second electrode may include a second reflective electrode configured to receive a power supply voltage and including a reflective material, and a second capping electrode covering the second reflective electrode.

In an exemplary embodiments of the inventive concept, a manufacturing method of a display device, the manufacturing method including: forming a pixel circuit on a base layer; forming a first insulation layer covering the pixel circuit; forming a first barrier and a second barrier extending in a first direction on the first insulation layer and disposed separately from each other in a second direction; forming a first electrode electrically connected to the pixel circuit on the first barrier and a second electrode separated from the first electrode on the second barrier; forming an insulation material layer on the first insulation layer, the first electrode and the second electrode; forming a rubbing groove on the insulation material layer in the second direction to form a second insulation layer; providing a light emitting element on the second insulation layer between the first barrier and the second barrier; and aligning the light emitting element along the rubbing groove.

In an exemplary embodiment, the forming the second insulation layer may include: disposing a rubbing roller around which a rubbing cloth is wound on the insulation material layer; and moving while rolling the rubbing roller in the second direction to form the rubbing groove in the second direction.

In an exemplary embodiment, the rubbing cloth may be provided with a rubbing file, and a thickness of the rubbing file may be differently set according to a width of the light emitting element in the first direction.

In an exemplary embodiment, a width of the light emitting element in the first direction may be smaller than or equal to a width of the rubbing groove.

In an exemplary embodiment, the insulation material layer may include a polyimide-based material.

In an exemplary embodiment, the first electrode may include a first reflective electrode including a reflective material, and a first capping electrode configured to cover the first reflective electrode, and the second electrode may include a second reflective electrode including a second reflective electrode configured to receive a power supply voltage and including a reflective material, and a second capping electrode covering the second reflective electrode.

In an exemplary embodiment, the forming the first electrode and the second electrode may include: forming a first conductive layer on the first insulation layer, the first barrier and the second barrier; forming a first photoresist pattern on the first conductive layer; removing a portion of the first conductive layer which is exposed by the first photoresist pattern to form the first reflective electrode and the second reflective electrode; forming the second conductive layer covering the first reflective electrode and the second reflective layer, after removing the first photoresist pattern; forming a second photoresist pattern on the second conductive layer; and removing a portion of the second conductive layer which is exposed by the second photoresist pattern to form the first capping electrode and the second capping electrode.

The manufacturing method may further include: forming a first connection electrode electrically connecting the first electrode and the light emitting element; and a second connection electrode electrically connecting the second electrode and the light emitting element.

The manufacturing method may further include, before the forming the first connection electrode, forming a third insulation layer covering the second connection electrode, wherein the first connection electrode is formed on the third insulation layer.

The manufacturing method may further include forming a fourth insulation layer covering the first connection electrode and the third insulation layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
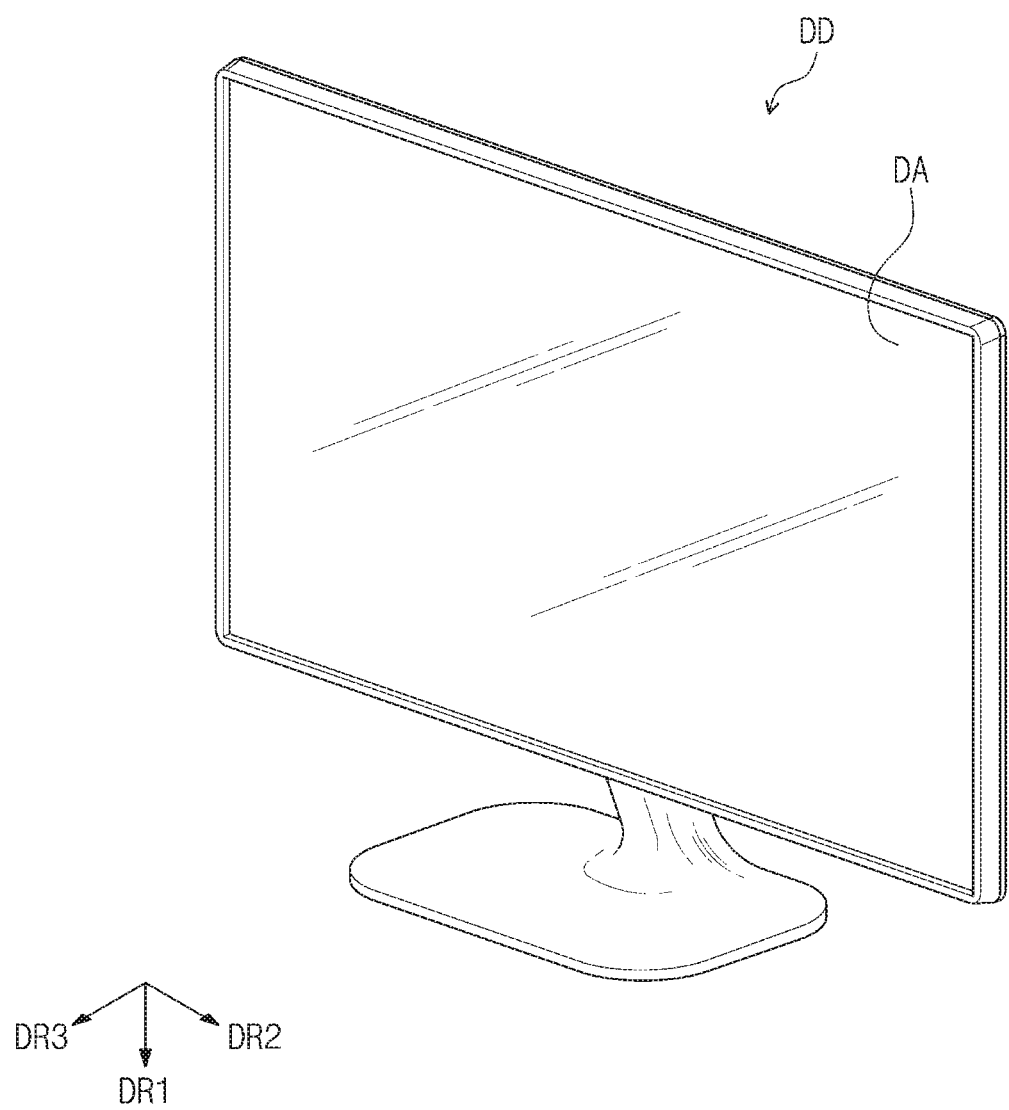
FIG. 1 is a perspective view of a display device according to an exemplary embodiment of the inventive concept.

It will be understood that when an element or layer is referred to as being "on", "to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element are exaggerated for effective description of the technical contents.

The term "and/or" includes any and all combinations of one or more of the associated items.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present inventive concept. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the inventive concept will be described with reference to the accompanying drawings.

FIG. 1 is a perspective view of a display device according to an exemplary embodiment of the inventive concept.

In relation to FIG. 1, the display device DD may display an image through a display area DA. FIG. 1 exemplarily illustrates that the display area DA is provided on a surface defined by a first direction DR1 and a second direction DR2 intersecting with the first direction DR1. However, in a display device according to another exemplary embodiment of the inventive concept, a display area may be provided on a curved surface.

A thickness direction of the display device DD is indicated by a third direction DR3. Directions indicated by the first to third directions DR1, DR2, and DR3 are relative concepts to each other and may be changed to other directions. In the present specification, the expression of "when viewed on a plane" may mean when viewed from the third direction DR3. In addition, the "thickness direction" may mean the third direction DR3.

In FIG. 1, the display device DD is exemplarily illustrated as a television screen. However, the display device DD may be used not only in a large electronic device such as an external billboard, but also in a small or medium electronic device such as a personal computer, a notebook computer, a personal digital assistant, a car navigation unit, a game console, a smartphone, a tablet, and a camera. In addition, these are presented only as an embodiment, and the display device DD may be also employed in other electronic devices without being deviated from the inventive concept.

Figure 2:
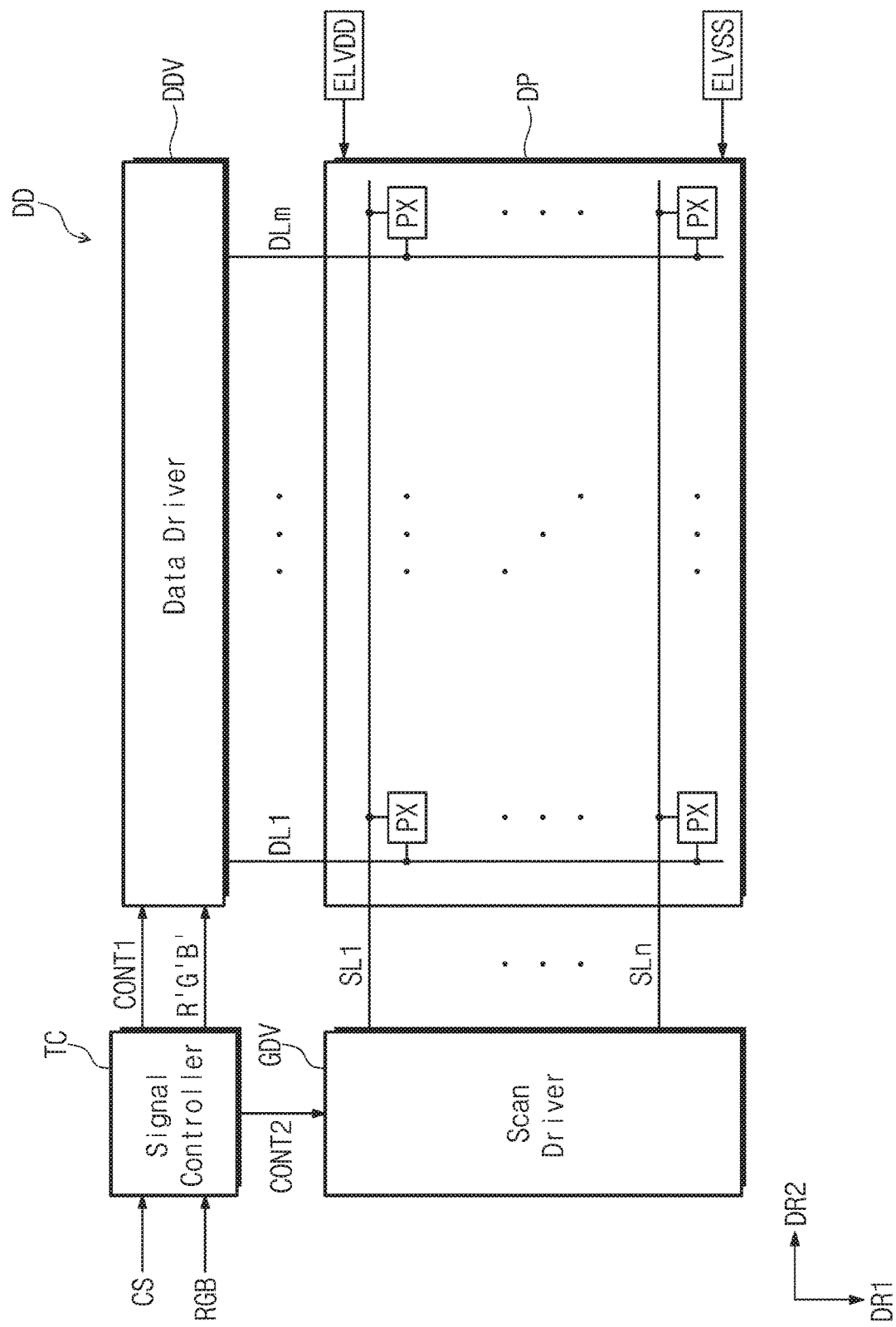
FIG. 2 is a block diagram of a display device according to an exemplary embodiment of the inventive concept.

FIG. 2 is a block diagram of a display device according to an exemplary embodiment of the inventive concept.

In relation to FIG. 2, the display device DD may include a display panel DP, a signal controller (or a timing controller) TC, a data driver DDV, and a scan driver GDV. Each of the signal controller TC, the data driver DDV, and the scan driver GDV may include a circuit.

The display panel DP may be a subminiature light emitting element display panel including a subminiature light emitting element. For example, the display panel DP may be a micro LED display panel.

The display panel DP may include a plurality of data lines DL1 to DLm, a plurality of scan lines SL1 to SLn, and a plurality of pixels PX connected to the plurality of data lines DL1 to DLm and the plurality of scan lines SL1 to SLn.

The data lines DL1 to DLm may extend in the first direction DR1 and arrayed along the second direction DR2 intersecting with the first direction DR1. The plurality of scan lines SL1-SLn may extend in the second direction DR2 and arrayed along the first direction DR1.

Each of the pixels PX may include a light emitting element and a pixel circuit electrically connected to the light emitting element. The pixel circuit may include a plurality of transistors. A first power supply voltage ELVDD and a second power supply voltage ELVSS may be provided to each of the pixels PX.

The pixels PX may be disposed in a regular pattern on the plane of the display panel DP. Each of the pixels PX may display one among primary colors or one of mixed colors. The primary colors may include red, green, and blue, and the mixed color may include various colors such as yellow, cyan, magenta, and white. However, the colors displayed by the pixels PX are not limited thereto.

The signal controller TC may receive image data RGB provided from an external device. The signal controller TC converts the image data RGB so as to match the operation of the display panel DP, generates converted image data R'G'B', and outputs the converted image data R'G'B' to the data driver DDV.

In addition, the signal controller TC may receive a control signal CS provided from the external device. The control signal CS may include a vertical synchronization signal, a horizontal synchronization signal, a main clock signal, a data enable signal, and the like. The signal controller TC provides a first control signal CONT1 to the data driver DDV, and a second control signal CONT2 to the scan driver GDV. The first control signal CONT1 is a signal for controlling the data driver DDV, and the second control signal CONT2 is a signal for controlling the scan driver GDV.

The data driver DDV may drive a plurality of data lines DL1 to DLm in response to the first control signal CONT1 received from the signal controller TC. The data driver DDV may be implemented as a stand-alone type integrated circuit to be electrically connected to one side of the display panel DP, or to be directly mounted on the display panel DP. In addition, the data driver DDV may be implemented as a single chip or include a plurality of chips.

The scan driver GDV drives a plurality of scan lines SL1 to SLn in response to the second control signal CONT2 from the signal controller TC. The scan driver GDV may be integrated in a prescribed area of the display panel DP. For example, the scan driver GDV may include a plurality of thin-film transistors formed through a Low Temperature Polycrystaline Silicon (LTPS) process or a Low Temperature Polycrystalline Oxide (LTPO) process. In addition, the scan driver GDV may be implemented as a stand-alone type integrated circuit chip to be electrically connected to one side of the display panel DP.

While a gate-on voltage is sequentially applied to one of the plurality of scan lines SL1 to SLn, each transistor in a row of pixels connected thereto is turned on. Here, the data driver' DDV provides data driving signals to the data lines DL1 to DLm. The data driving signals provided to the data lines DL1 to DLm are applied to respective corresponding pixels through the turned-on transistors. The data driving signals may be analog voltages corresponding to gradation values of image data.

Figure 3:
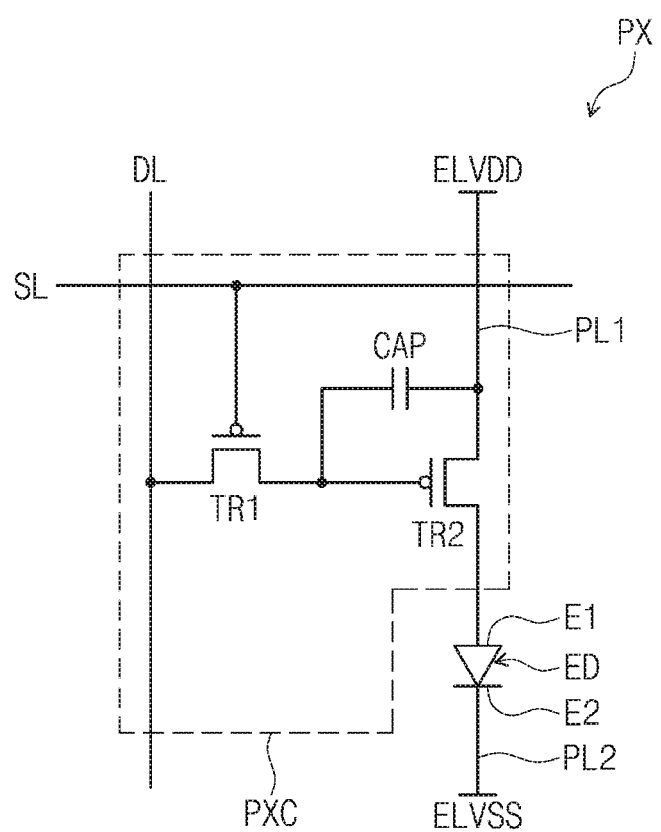
FIG. 3 is an equivalent circuit diagram of a pixel according to an exemplary embodiment of the inventive concept.

FIG. 3 is an equivalent circuit diagram of a pixel according to an exemplary embodiment of the inventive concept. FIG. 3 show the equivalent circuit diagram of one pixel PX among the plurality of pixels PX illustrated in FIG. 2.

In reference to FIG. 3, a pixel PX may be connected to a plurality of signal lines. In the present embodiment, among the plurality of signal lines, a scan line SL, a data line DL, a first power lines PL1 and a second power line PL2 are exemplarily illustrated. However, these are exemplarily illustrated, and the pixel PX according to an exemplary embodiment of the present inventive concept may be additionally connected to various signal lines, and is not limited to any one embodiment.

The pixel PX may include a light emitting element ED, a first electrode E1, a second electrode E2, and a pixel circuit PXC. The pixel circuit PXC may include a first thin film transistor TR1, a capacitor CAP, and a second thin-film transistor TR2. This is exemplarily illustrated, and the number of the thin film transistors and the capacitors included in the pixel circuit PXC is not limited to that shown in FIG. 3. For example, the pixel circuit PXC in another exemplary embodiment of the inventive concept may include seven thin film transistors and one capacitor.

The first thin film transistor TR1 may be a switching transistor configured to control on or off of the pixel PX. The first thin film transistor TR1 may transmit or cut off a data signal provided through the data line DL in response to a scan signal provided through the scan line SL.

The capacitor CAP is connected to the first thin film transistor TR1 and the first power line PL1. The capacitor CAP charges by a charge amount corresponding to a difference between the data signal provided from the first thin film transistor TR1 and the first power supply voltage ELVDD applied to the first power line PL.

The second thin film transistor TR2 is connected to the first thin film transistor TR1, the capacitor CAP, and the light emitting element ED. The second thin film transistor TR2 controls a driving current flowing through the light emitting element ED in response to the charge amount stored in the capacitor CAP. The current flowing through the second thin film transistor TR2 may be determined according to the charge amount charged in the capacitor CAP.

Each of the first thin film transistor TR1 and the second thin film transistor TR2 may be an N-type thin film transistor or a P-type thin film transistor. In addition, in another exemplary embodiment of the inventive concept, any one of the first thin film transistor TR1 and the second thin film transistor TR2 may be an N-type thin film transistor and the other may be a P-type thin film transistor.

The light emitting element ED may be connected to the second thin film transistor TR2 and the second power line PL2. For example, the light emitting element ED may be electrically connected to the first electrode E1 electrically connected to the second thin-film transistor TR2, and the second electrode E2 electrically connected to the second power line PL2. The first electrode E1 may be electrically connected to the pixel circuit PXC, and the second electrode E2 may receive the power supply voltage, e.g. the second power supply voltage ELVSS through the second power line PL2.

The light emitting element ED may emit light corresponding to a current flowing through the light emitting element ED. For example, the electrons and the holes are recombined close to the light emitting element ED and form an exciton to emit light.

The light emitting element ED may be a subminiature LED element. The subminiature LED element may be an LED element having the length from several nanometers to hundred micrometers. However, the length of the subminiature LED element is only for example, and is not limited to the above numerical range.

FIG. 3 exemplarily illustrates that one light emitting element ED is connected between the second thin film transistor TR2 and the second power line PL2, but the light emitting element ED may be provided in plurality. The provided plurality of light emitting elements ED may be connected in parallel.

Figure 4A:
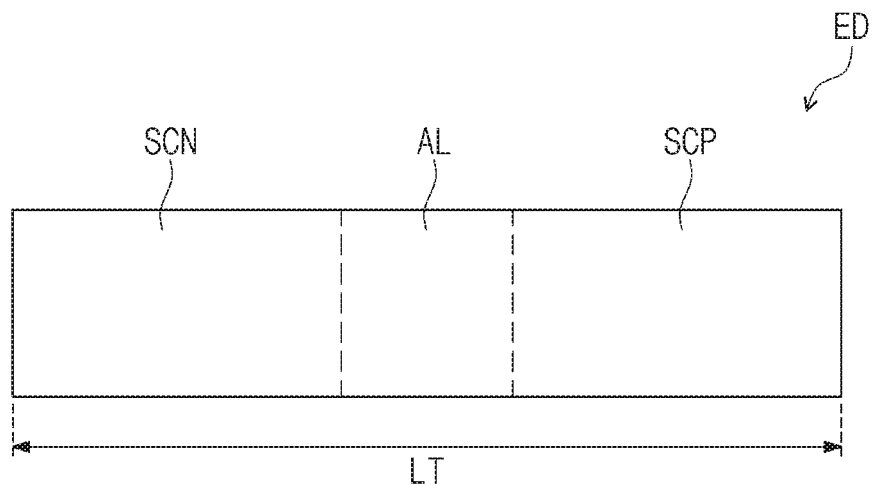
FIG. 4A is a cross-sectional view of a light emitting element according to an exemplary embodiment of the inventive concept.

FIG. 4A is a cross-sectional view of a light emitting element according to an exemplary embodiment of the inventive concept.

The light emitting element ED may have various shapes including a cylindrical shape or a polygonal column shape. FIG. 4A illustrates a cross section of the light emitting element ED.

In relation to FIG. 4A, the light emitting element ED may include an n-type semiconductor layer SCN, a p-type semiconductor layer SCP, and an active layer AL. The active layer AL may be disposed between the n-type semiconductor layer SCN and the p-type semiconductor layer SCP.

The n-type semiconductor layer SCN may be provided with an n-type dopant doped in a semiconductor layer, and the p-type semiconductor layer SCP may be provided with a p-type dopant doped in the semiconductor layer. The semiconductor layer may include a semiconductor material, and the semiconductor material may be, for example, GaN, AN, AlGaN, InGaN, InN, InAlGaN, or AlInN, but is not limited thereto. The n-type dopant may be silicon (Si), germanium (Ge), tin (Sn), selenium (Se), tellurium (Te), or a combination thereof, but is not limited thereto. The p-type dopant may be magnesium (Mg), zinc (Zn), calcium (Ca), strontium (Sr), barium (Ba), or a combination thereof, but is not limited thereto.

The active layer AL may be formed in any one among a single quantum well structure, a multiple quantum well structure, a quantum wire structure, or a quantum dot structure. The active layer AL may be a region in which an electron injected through the n-type semiconductor layer SCN and a hole injected through the p-type semiconductor layer SCP are recombined. The active layer AL is a layer from which light having energy determined by an energy band gap of a material is emitted. The position of the active layer AL may be variously changed according to the type of a diode.

The n-type semiconductor layer SCN may be connected to any one of the first electrode E1 (refer to FIG. 4B) and the second electrode E2 (refer to FIG. 4B), and the p-type semiconductor layer SCP may be connected to the other one thereof.

The length LT of the light emitting element ED may be from several nanometers to several hundred micrometers. For example, the length LT of the light emitting element ED may be from several nanometers to several hundred micrometers, and for example, from about 1 micrometer to about 100 micrometers.

Figure 4B:
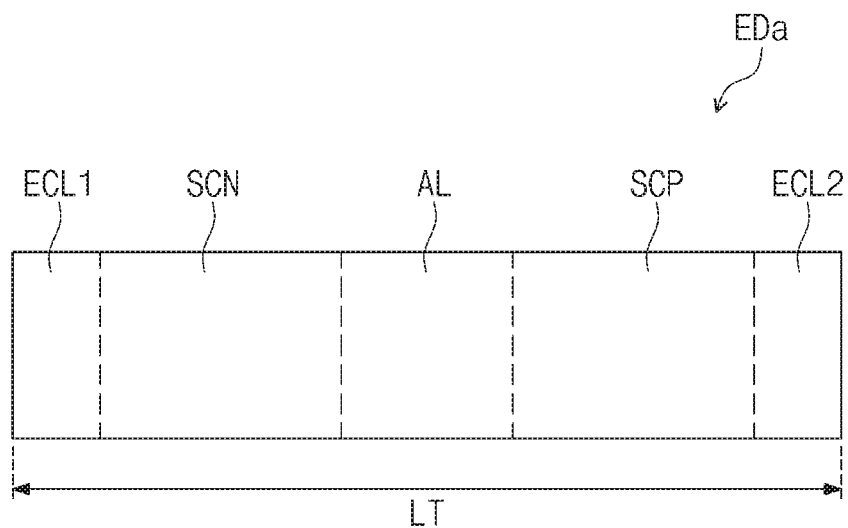
FIG. 4B is a cross-sectional view of a light emitting element according to an exemplary embodiment of the inventive concept.

FIG. 4B is a cross-sectional view of a light emitting element according to an exemplary embodiment of the inventive concept.

In relation to FIG. 4B, the light emitting element EDa may further include the first electrode layer ECL1 and the second electrode layer ECL2 in comparison to the light emitting element ED of FIG. 4A.

The first electrode layer ECL1 may be disposed adjacent to the n-type semiconductor layer SCN and the second electrode layer ECL2 may be disposed adjacent to the p-type semiconductor layer SCP. For example, the first electrode layer ECL1, the n-type semiconductor layer SCN, the active layer AL, the p-type semiconductor layer SCP, and the second electrode layer ECL2 may be sequentially stacked.

Each of the first electrode layer ECL1 and the second electrode layer ECL2 may be formed of a metal or an alloy of metals. For example, each of the first electrode layer ECL1 and the second electrode layer ECL2 may be formed of any one selected from among molybdenum (Mo), chromium (Cr), Nickel (Ni), gold (Au), aluminum (Al), titanium (Ti), platinum (Pt), vanadium (V), tungsten (W), lead (Pb), copper (Cu), rhodium (Rh) and iridium (Jr), or an alloy thereof. The first electrode layer ECL1 and the second electrode layer ECL2 may include the same material, or different materials from each other.

Figure 4C:
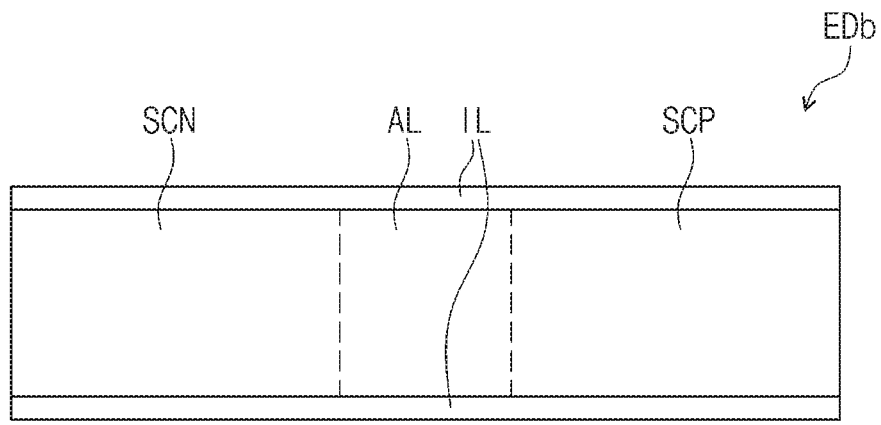
FIG. 4C is a cross-sectional view of a light emitting element according to an exemplary embodiment of the inventive concept.

FIG. 4C is a cross-sectional view of a light emitting element according to an exemplary embodiment of the inventive concept.

In relation to FIG. 4C, the light emitting element EDb may further include an insulation layer IL in comparison to the light emitting element ED of FIG. 4A. For example, the light emitting element EDb may have a core-shell structure.

The insulation layer IL may cover the n-type semiconductor layer SCN, the p-type semiconductor layer SCP, and the active layer AL, and may protect external surfaces of the n-type semiconductor layer SCN, the p-type semiconductor layer SCP, and the active layer AL. In another exemplary embodiment of the inventive concept, the insulation layer IL may cover only the active layer AL.

Figure 4D:
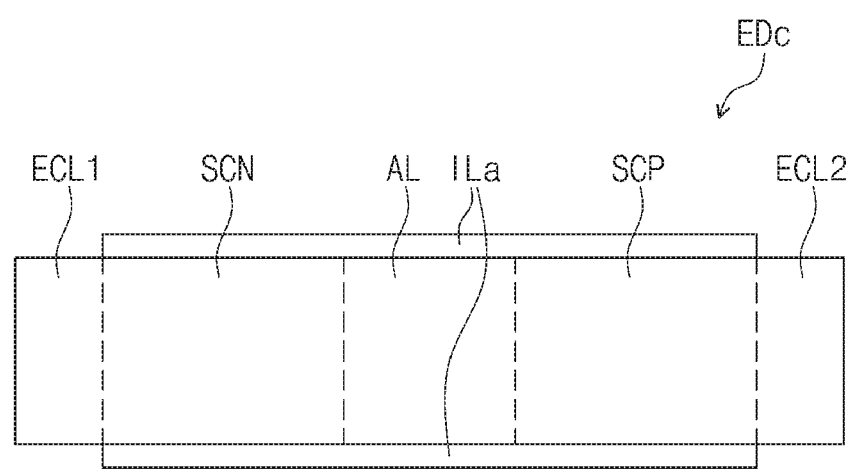
FIG. 4D is a cross-sectional view of a light emitting element according to an exemplary embodiment of the inventive concept.

FIG. 4D is a cross-sectional view of a light emitting element according to an exemplary embodiment of the inventive concept.

In relation to FIG. 4D, the light emitting element EDc may further include an insulation layer ILa in comparison to the light emitting element EDa of FIG. 4B.

The insulation layer ILa may cover the n-type semiconductor layer SCN, the p-type semiconductor layer SCP, and the active layer AL, but may not cover the first electrode layer ECL1 and the second electrode layer ECL2. However, in another exemplary embodiment of the inventive concept, the insulation layer ILa may cover at least a part of the first electrode layer ECL1 and the second electrode layer ECL2, or may cover all of the first electrode layer ECL1 and the second electrode layer ECL2.

Figure 5:
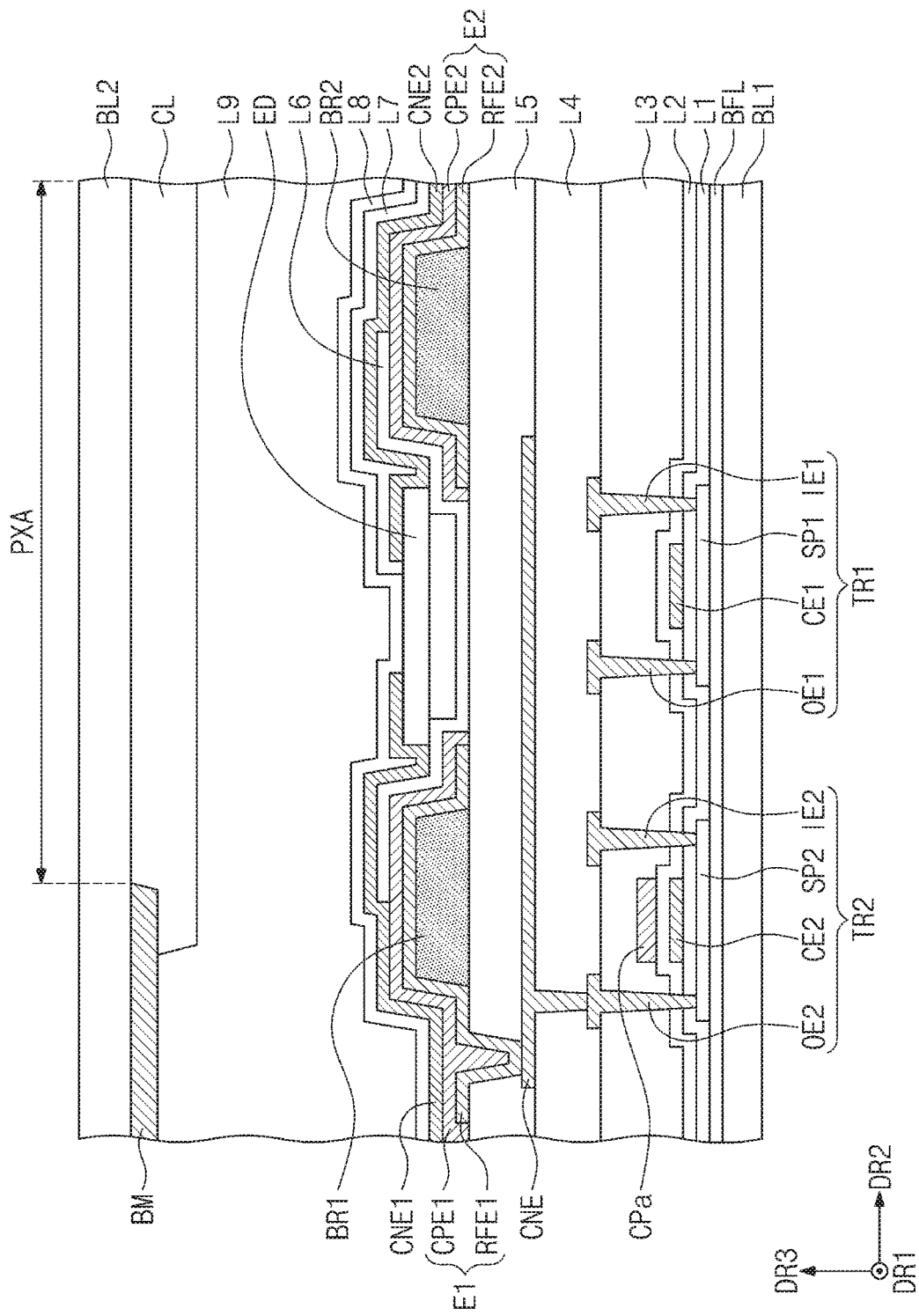
FIG. 5 is a cross-sectional view of a display panel according to an exemplary embodiment of the inventive concept.
Figure 6:
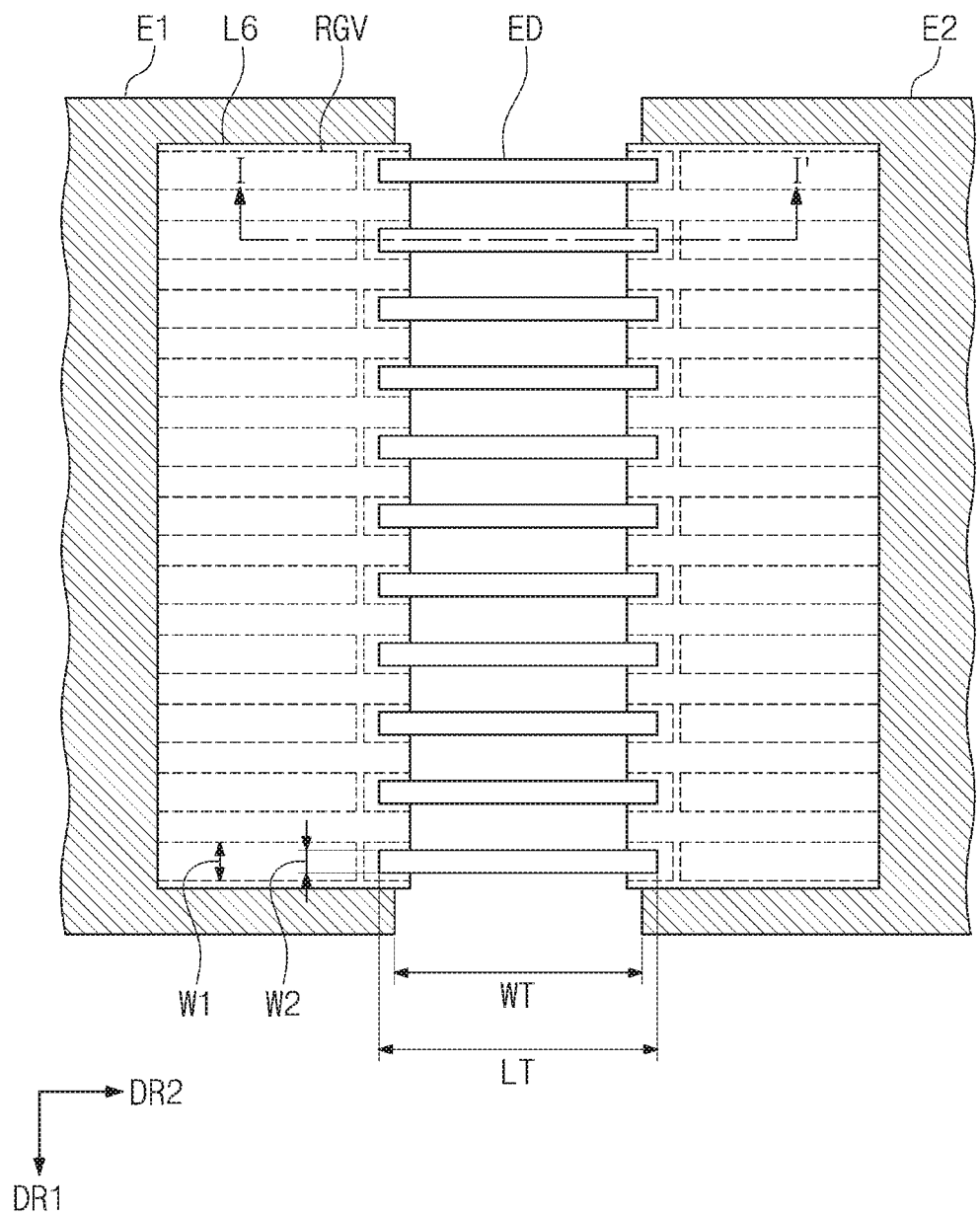
FIG. 6 is a plan view illustrating a part of a display panel according to another exemplary embodiment of the inventive concept.

FIG. 5 is a cross-sectional view of a display panel according to an exemplary embodiment of the inventive concept, and FIG. 6 is a plan view of a partial configuration of a display panel according to an exemplary embodiment of the inventive concept. For easiness of description, FIGS. 5 and 6 illustrate an area corresponding to one pixel with some components omitted.

In relation to FIGS. 5 and 6, a first base layer BL1 and a second base layer BL2 may face each other. Each of the first base layer BL1 and the second base layer BL2 may have a laminate structure including a silicon substrate, a plastic substrate, a glass substrate, an insulation film, or a plurality of insulation layers.

A buffer layer BFL may be provided on the first base layer BL1. A first thin film transistor TR1 and a second thin film transistor TR2 may be disposed on the buffer layer BFL.

The first thin film transistor TR1 may include a first control electrode CE1, a first input electrode IE1, a first output electrode OE1 and a first semiconductor pattern SP1. The second thin film transistor TR2 may include a second control electrode CE2, a second input electrode 1E2, a second output electrode OE2 and a second semiconductor pattern SP2.

The first semiconductor pattern SP1 and second semiconductor pattern SP2 may be disposed on the buffer layer BFL. In this case, the first semiconductor pattern SP1 and the second semiconductor SP2 may have a higher adhesive force with respect to the buffer layer BFL than that in a case where the first semiconductor pattern SP1 and the second semiconductor SP2 are directly formed on the first base layer BL1. Alternatively, the buffer layer BFL may be a barrier layer configured to protect a bottom surface of each of the first semiconductor pattern SP1 and the second semiconductor pattern SP2. In this case, the buffer layer BFL may prevent contaminants, a moisture, or the like from the first base layer BL1 from being permeated into the first semiconductor pattern SP1 and the second semiconductor pattern SP2.

A first insulation layer L1 may be disposed on the buffer layer BFL, and cover the first semiconductor pattern SP1 and the second semiconductor pattern SP2. The first insulation layer L1 may include an inorganic material. The inorganic material may be, for example, silicon nitride, silicon oxynitride, silicon oxide, titanium oxide, or aluminum oxide, but is not limited thereto.

The first control electrode CE1 and the second control electrode CE2 may be disposed on the first insulation layer L1. A second insulation layer L2 may be disposed on the first insulation layer L1, and cover the first control electrode CE1 and the second control electrode CE2. The second insulation layer L2 may include an inorganic material.

A capacitor CAP (see FIG. 3) may include a first cap electrode and a second cap electrode CPa. For example, the first cap electrode may branch from the second control electrode CE2, and the second cap electrode CPa may be disposed on the second insulation layer L2.

A third insulation layer L3 is disposed on the second insulation layer L2, and covers the second cap electrode CPa. The first input electrode IE1, the first output electrode OE1, the second input electrode IE2, and the second output electrode OE2 may be disposed on the third insulation layer L3. The first input electrode IE1 and the first output electrode OE1 may be connected to the first semiconductor pattern SP1 via through-holes that is formed in the first to third insulation layers L1, L2 and L3. The second input electrode IE2 and the second output electrode OE2 may be connected to the second semiconductor pattern SP2 via the through-holes that is formed in the first to third insulation layers L1, L2 and L3. On the third insulation layer L3, not only the first input electrode IE1, the first output electrode OE1, the second input electrode IE2 and the second output electrode OE2, but also at least parts of respective signal wirings, for example, scan lines or data lines may be disposed.

A fourth insulation layer L4 may be disposed on the third insulation layer L3, and cover the first input electrode IE1, the first output electrode OE1, the second input electrode 1E2 and the second output electrode OE2. The fourth insulation layer L4 may have a single layer or a plurality of layers, and may include an organic material and/or an inorganic material.

A connection electrode CNE may be disposed on the fourth insulation layer L4. On the fourth insulation layer L4, not only the connection electrode CNE, but also at least the other parts of the signal wirings, for example, the scan lines or the data lines may be disposed. The connection electrode CNE may be connected to the second output electrode OE2.

A fifth insulation layer L5 may be disposed on the fourth insulation layer L4 and cover the connection electrode CNE. The fifth insulation layer L5 may include an organic material. The fifth insulation layer L5 may cover the pixel circuit PXC (see FIG. 3) disposed therebelow, and provide a flat surface.

A first barrier BR1 and a second barrier BR2 are disposed on the fifth insulation layer L5. Each of the first barrier BR1 and a second barrier BR2 may extend in the first direction DR1. The second barrier BR2 may be separated from the first barrier BR1 in the second direction DR2 which is substantially perpendicular to the first direction DR1. The first barrier BR1 and the second barrier BR2 may include an identical material. For example, the first barrier BR1 and the second barrier BR2 may include an organic material.

The first electrode E1 may be disposed on the first barrier BR1 and the second electrode E2 may be disposed on the second barrier BR2. The first electrode E1 may extend in the first direction DR1 and cover the first barrier BR1, and the second electrode E1 may be extended in the first direction DR1 and cover the second barrier BR2. In other words, the first barrier BR1 may be disposed between the first electrode E1 and the fifth insulation layer L5, and the second barrier BR2 may be disposed between the second electrode E2 and the fifth insulation layer L5.

A through-hole is provided in the fifth insulation layer L5, and the connection electrode CNE may be exposed by the through-hole. The first electrode E1 may be electrically connected to the exposed portion of the connection electrode CNE. Although not shown in the drawing, the second electrode E2 may be electrically connected to the second power line PL2 (see FIG. 3). In other words, the second power supply voltage ELVSS (see FIG. 3) may be provided to the second electrode E2.

The first electrode E1 may include a first reflective electrode RFE1 and a first capping electrode CPE1, and the second electrode E2 may include a second reflective electrode RFE2 and a second capping electrode CPE2.

Each of the first reflective electrode RFE1 and the second reflective electrode RFE2 may include a reflective material. Each of the first reflective electrode RFE1 and the second reflective electrode RFE2 may have a single layer structure or a multiple layer structure. For example, each of the first reflective electrode RFE1 and the second reflective electrode RFE2 may have a structure with indium tin oxide (ITO), gold (Ag), and indium tin oxide (ITO) sequentially stacked.

The first capping electrode CPE1 may cover the first reflective electrode RFE1, and the second capping electrode CPE2 may cover the second reflective electrode RFE2. The first capping electrode CPE1 may completely cover the first reflective electrode RFE1, and the second capping electrode CPE2 may completely cover the second reflective electrode RFE2 in a plan view. For example, each of the first capping electrode CPE1 and the second capping electrode CPE2 may include at least one among indium zinc oxide (IZO), indium tin oxide (ITO), indium gallium oxide (IGO), indium zinc gallium oxide (IGZO), and a mixture/a compound thereof.

Between at least the first and second barriers BR1 and BR2, a sixth insulation layer L6 may be disposed on the first electrode E1, the fifth insulation layer L5 and the second electrode E2. In detail, the sixth insulation layer L6 may be disposed on the fifth insulation layer L5, on the first capping electrode CPE1, and on the second capping electrode CPE2 in an area disposed between the first and second capping electrodes CPE1 and CPE2. The sixth insulation layer L6 may partially overlap the first capping electrode CPE1, and partially overlap the second capping electrode CPE2. For example, the sixth insulation layer L6 may be disposed on the first capping electrode CPE1 so as to overlap the first barrier BR1, and on the second capping electrode CPE2 so as to overlap the second barrier BR2. However, the structure of the sixth insulation layer L6 is not limited thereto, and the sixth insulation layer L6 may be disposed so as not to overlap the first and second barriers BR1 and BR2.

The sixth insulation layer L6 may include an organic material. For example, the sixth insulation layer L6 may be formed of a polyimide-based material. A rubbing groove (RGV) may be provided on a top surface of the sixth insulation layer L6 and extending in the second direction DR2.

The light emitting element ED is disposed on the sixth insulation layer L6. The light emitting element ED may be provided in plurality, and the provided plurality of light emitting elements may be connected in parallel. Each light emitting element ED may be aligned in the second direction DR2 along the rubbing groove RGV on the sixth insulation layer L6. Due to the rubbing groove RGV, a misalignment, in which the light emitting element ED is not formed parallel to the second direction DR2, may be reduced.

The light emitting element ED may be electrically connected to the first electrode E1 and the second electrode E2. The light emitting element ED may be disposed between the first electrode E1 and the second electrode E2. The light emitting element ED may be disposed so that one end portion overlaps the first electrode E1 and the other end portion overlaps the second electrode E2.

The light emitting element ED may be electrically connected to the first electrode E1 via a first connection electrode CNE1, and to the second electrode by a second connection electrode CNE2.

The first connection electrode CNE1 may be disposed on the light emitting element ED, the sixth insulation layer L6, and the first electrode E1. In particular, the first connection electrode CNE1 may be electrically connected to the first electrode E1 in a portion exposed by the sixth insulation layer L6 on the first capping electrode CPE1.

The second connection electrode CNE2 may be disposed on the light emitting element ED, the sixth insulation layer L6, and the second electrode E2. In particular, the second connection electrode CNE2 may be electrically connected to the second electrode E2 in a portion exposed by the sixth insulation layer L6 on the second capping electrode CPE2.

A seventh insulation layer L7 may be disposed on the second connection electrode CNE2. Although the length of the light emitting element ED is smaller than several micrometers, the second connection electrode CNE2 and the first connection electrode CNE1 may not directly contact by the seventh insulation layer L7. However, this is only an exemplary embodiment of the inventive concept, and in another exemplary embodiment of the inventive concept, the first connection electrode CNE1 and the second connection electrode CNE2 may be substantially simultaneously formed through an identical process. In this embodiment, the seventh insulation layer L7 may be omitted.

The first connection electrode CNE1 and the second connection electrode CNE2 may include a conductive material. For example, the conductive material may include at least one among indium zinc oxide (IZO), indium tin oxide (ITO), indium gallium oxide (IGO), indium zinc gallium oxide (IGZO), and a mixture/a compound thereof. However, the inventive concept is not limited hereto. For example, the conductive material may be a metal material, and the metal material may include, for example, molybdenum, silver, titanium, copper, aluminum, or an alloy thereof.

An eight insulation layer L8 may be disposed on the first connection electrode CNE1 and the seventh insulation layer L7. The eighth insulation layer L8 may be an encapsulation layer.

A light shielding layer BM may be disposed on one side of the second base layer BL2 facing the first base layer BL1. An opening part may be provided in the light shielding layer BM, and a wavelength conversion part CL may cover the opening part. An area exposed by the opening part may correspond to a pixel light emission area PXA.

The wavelength conversion part CL may include a light emitting body. For example, the light emitting body may absorb first light provided from the light emitting element ED, convert the wavelength of the first light, and emit second light having a different color from the first light. The light emitting body may be, for example, a quantum dot. The first light may be blue light, and the second light may be green or red light. However, this is exemplary, and the inventive concept is not limited thereto. In addition, in another embodiment of the inventive concept, the wavelength conversion unit CL may be replaced with a color filter. The color filter may absorb light of a specific color to realize a color. In another exemplary embodiment of the inventive concept, the wavelength conversion unit CL may be omitted. In this case, the light emitting element ED may emit blue light, green light, or red light.

A ninth insulation layer L9 may be disposed between the wavelength conversion unit CL and the eighth insulation layer L8. For example, the first base layer BL1 on which the pixel circuit PXC (see FIG. 3) and the light emitting element ED are disposed, and the second base layer BL2 on which the wavelength conversion unit CL and the light shielding layer BM are disposed may be coupled by the ninth insulation layer L9. For example, the ninth insulation layer L9 may be an optically clear adhesive film, an optically clear resin, or a pressure sensitive adhesive film. However, this is illustrated as an example, and in another exemplary embodiment of the inventive concept, the ninth insulation layer L9 may be omitted.

Figure 7:
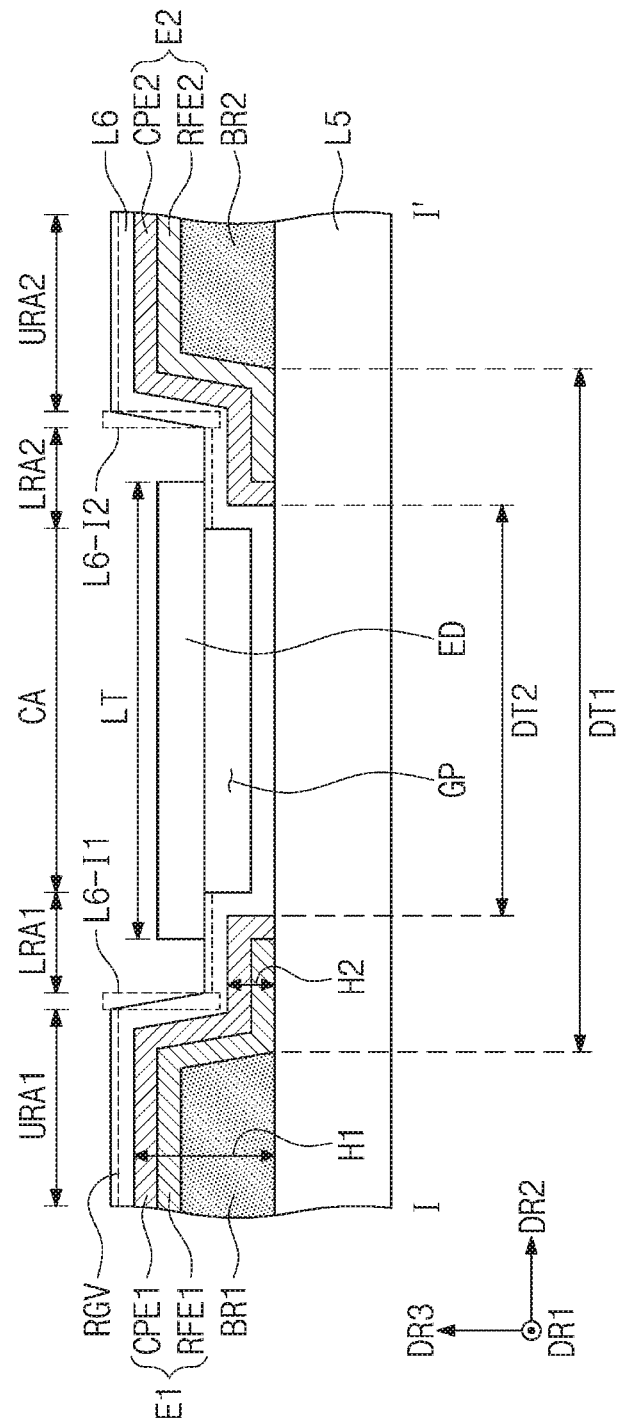
FIG. 7 is an example of a cross-sectional view cut along I-I' illustrated in FIG. 6.

FIG. 6 is a plan view illustrating a part of the configuration of a display panel according to an exemplary embodiment of the inventive concept, and FIG. 7 is a cross-sectional view cut along line I-I' of FIG. 6.

In relation to FIGS. 6 and 7, a distance DT1 between the first and second barriers BR1 and BR2 in the second direction DR2 is greater than a distance DT2 between the first and second electrodes E1 and E2. The distance DT2 between the first and second electrodes E1 and E2 in the second direction DR2 is smaller than that the length LT of the light emitting element ED in the second direction DR2.

In the sixth insulation layer L6, first and second upper areas URA1 and URA2 may be positioned at a first height H1 from the top surface of the fifth insulation layer L5, first and second lower areas LRA1 and LRA2 may be positioned at a second height H2 from the top surface of the fifth insulation layer L5, and a center area CA between the first and second lower areas LRA1 and LRA2 may be positioned as a height lower than the first height H1 and the second height H2. The first height H1 is defined as the sum of the thickness of the first barrier BR1 and the thickness of the first electrode E1 or the sum of the thickness of the second barrier BR2 and the thickness of the second electrode E2. The second height H2 may be defined as the thickness of the first electrode E1 or the thickness of the second electrode E2. In the center area CA, the sixth insulation layer L6 is directly formed on the fifth insulation layer L5 at a height lower than that of the first and second lower areas LRA1 and LRA2.

The rubbing groove RGV may be provided in the sixth insulation layer L6 in correspondence to the first and second upper areas URA1 and URA2 and the first and second lower areas LRA1 and LRA2.

The sixth insulation layer L6 has a first slope part L6-I1 between the first upper area URA1 and the first lower area LRA1, and a second slope part L6-I2 between the second upper area URA2 and the second lower area LRA2. The rubbing groove RGV may not be formed in the first and second slope parts L6-I1 and L6-I2 due to a height difference. However, the inventive concept is not limited thereto, and the rubbing home RGV may be formed in the first and second slope parts L6-I1 and L6-I2 according to a rubbing process condition.

FIGS. 6 and 7 illustrate structures in which the rubbing groove RGV is not formed in the sixth insulation layer L6 positioned in the center area CA, but the inventive concept is not limited thereto. In the center area CA, a gap GP is provided between the sixth insulation layer L6 and the light emitting element ED. The rubbing groove RGV may be also provided in the top surface of the sixth insulation layer L6 positioned in the center area CA according to a rubbing process condition.

The rubbing groove RGV may be dented and formed by a prescribed depth from the top surface of the sixth insulation layer L6. For better understanding, FIGS. 6 and 7 illustrate the rubbing groove RGV in a dotted line.

As illustrated in FIG. 6, the rubbing groove RGV may extend and be formed in the second direction DR2. A plurality of rubbing grooves RGV may be provided in the sixth insulation layer L6, and the plurality of rubbing grooves RGV may be arrayed in the first direction DR1. A plurality of light emitting elements ED disposed on the sixth insulation layer L6 may be aligned in the second direction DR2 along the extension direction of the rubbing groove RGV, and may be arrayed in the first direction DR1.

A width w1 in the first direction DR1 of the rubbing groove RGV may be equal to or greater than a width w2 in the first direction DR1 of the light emitting element ED. For example, the width w2 in the first direction DR1 of the light emitting element ED is about 1 to about 1.5 micrometers, and the length LT of the light emitting element ED in the second direction DR2 may be about 3.5 micrometers. In this case, the width w1 in the first direction DR1 of the rubbing groove RGV may be about 1.5 micrometers.

When viewed on the plane, both end parts of the light emitting element ED are disposed in the rubbing groove RGV, and may be aligned so that the length direction of the light emitting element ED is parallel to the second direction DR2.

As an example of the inventive concept, the length LT of the light emitting element ED may be greater than a distance WT between the first electrode E1 and the second electrode E2. However, the inventive concept is not limited thereto, and the length LT of the light emitting element ED may be set to be equal to or smaller than the distance WT between the first and second electrodes E1 and E2.

Although not shown in the drawing, when the length LT of the light emitting element ED is set to be equal to or smaller than the distance WT between the first and second electrodes E1 and E2, the light emitting element ED may not overlap the first and second electrodes E1 and E2.

FIGS. 8A to 8I are drawings showing respectively parts of a manufacturing process of a display device according to an exemplary embodiment of the inventive concept. FIGS. 8A to 8I illustrate respectively parts of a process of manufacturing the display panel shown in FIG. 5. Hereinafter, overlapping descriptions about the same components as those in FIG. 5 will be omitted.

Figure 8A:
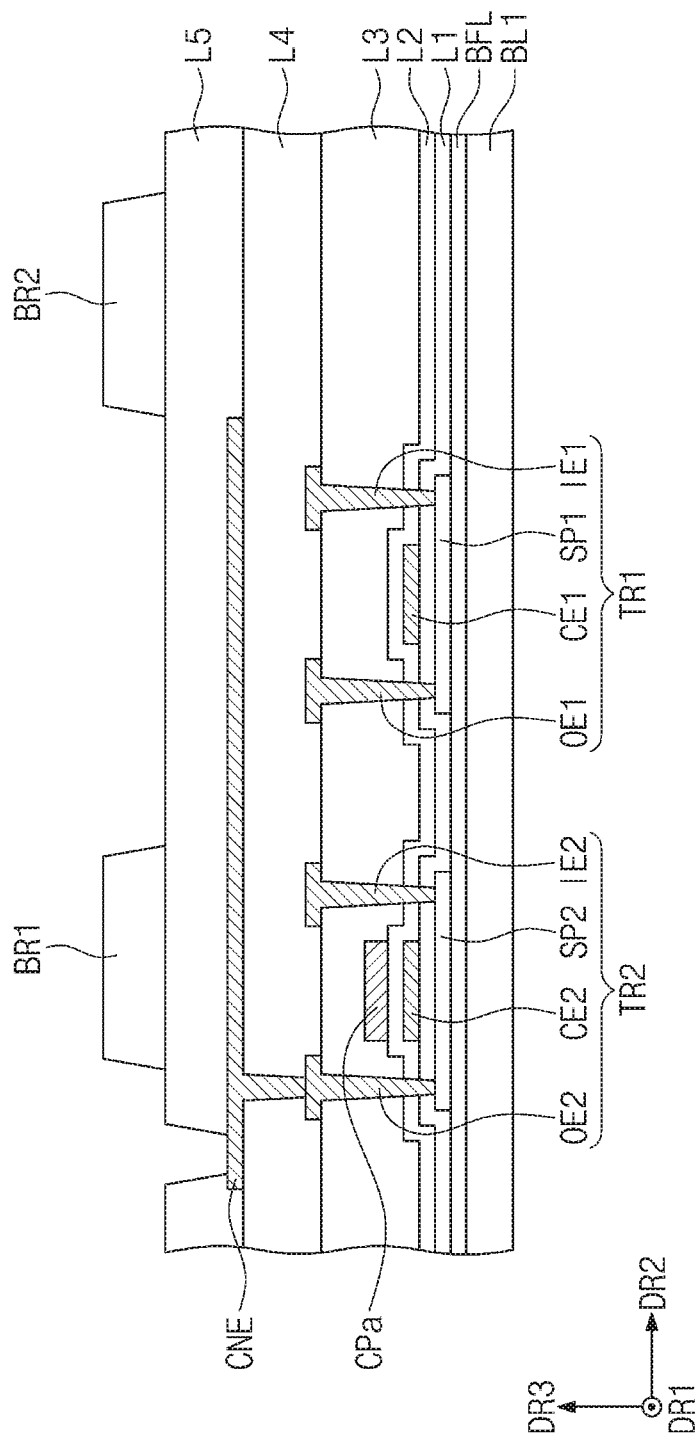
FIGS. 8A, 8B, 8C, 8D, 8E, 8F, 8G, 8H, 8I and 8J are drawings showing respectively parts of a manufacturing process of a display device according to an exemplary embodiment of the inventive concept.

In relation to FIG. 8A, the first base layer BL1 is prepared. Although not separately shown in the drawing, in the manufacturing process, the first base layer BL1 may be disposed on a supporting substrate. After the display panel is manufactured, the supporting substrate may be removed.

The pixel circuit PXC (see FIG. 3) including the first thin film transistor TR1 and the second thin film transistor TR2 may be formed on the first base layer BL1. The connection electrode CNE may be formed on the pixel circuit PXC to cover the pixel circuit PXC. The fifth insulation layer L5 configured to cover the pixel circuit PXC and the connection electrode CNE are formed. The fifth insulation layer L5 may include an organic material. The fifth insulation layer L5 may provide a flat surface on at least a part thereof. The first barrier BR1 and the second barrier BR2 are disposed on the fifth insulation layer L5.

Figure 8B:
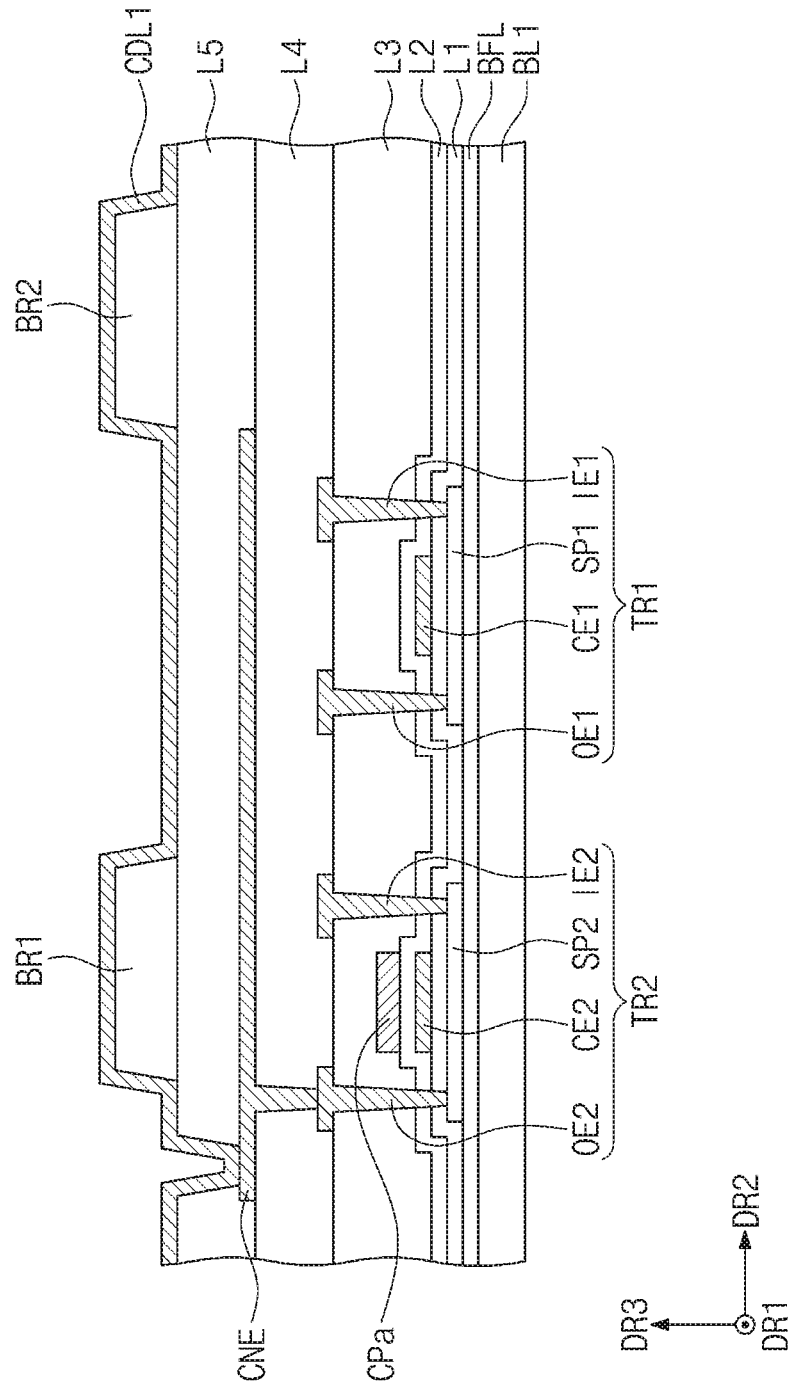

In relation to FIG. 8B, a first conductive layer CDL1 configured to cover the first barrier BR1 and the second barrier BR2 is formed on the fifth insulation layer L5. The first conductive layer CDL1 may include a plurality of conductive layers, and for example, the first conductive layer CDL1 may be formed by sequentially stacking indium tin oxide (ITO), silver (Ag), and indium tin oxide (ITO).

Figure 8C:
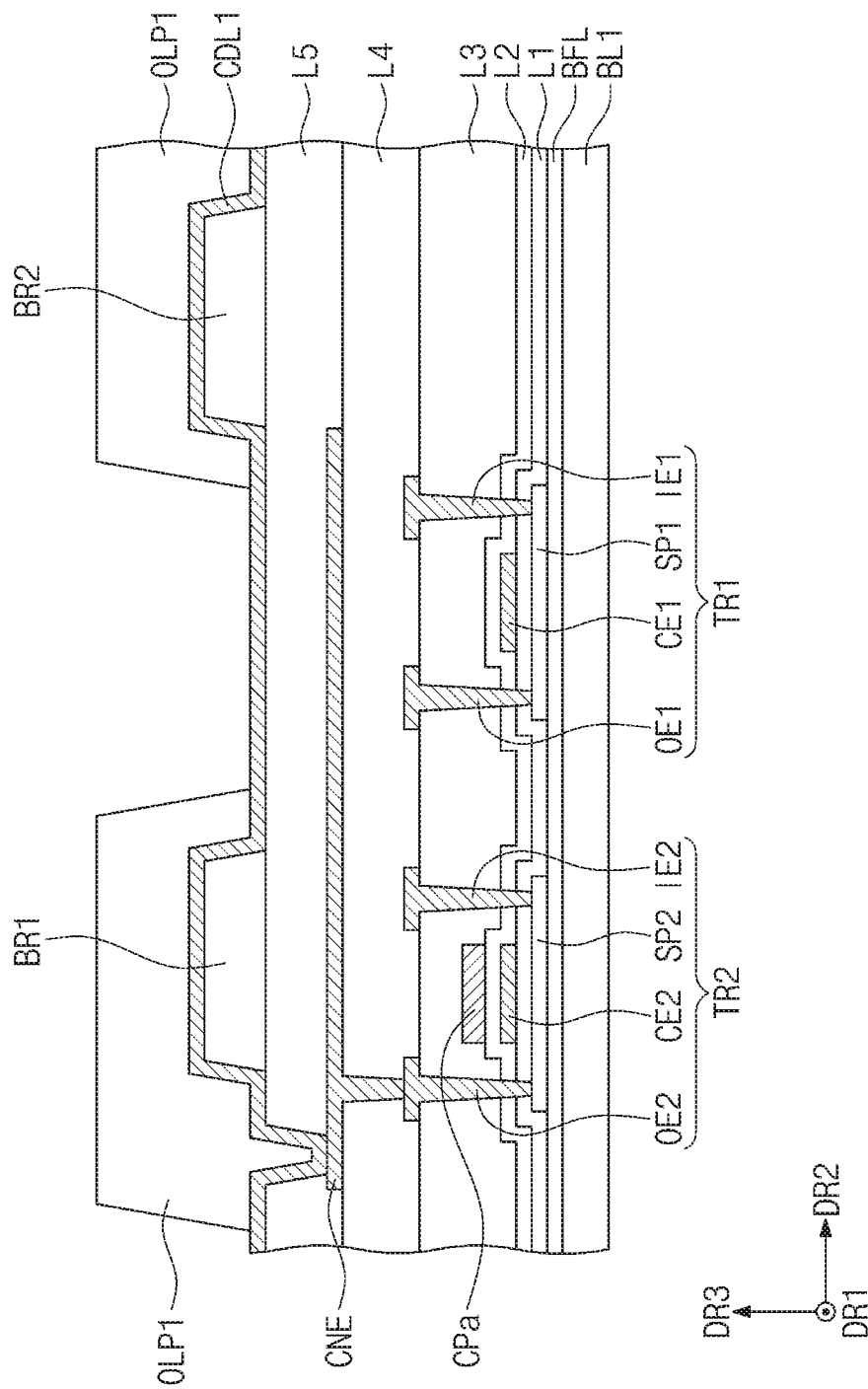

In relation to FIG. 8C, a first photoresist pattern OLP1 is formed on the first conductive layer CDL1. The first photoresist pattern OLP1 may be provided after forming a positive photoresist layer or a negative photoresist layer and then patterning the same. For example, the patterning process may include a photo lithography process.

Figure 8D:
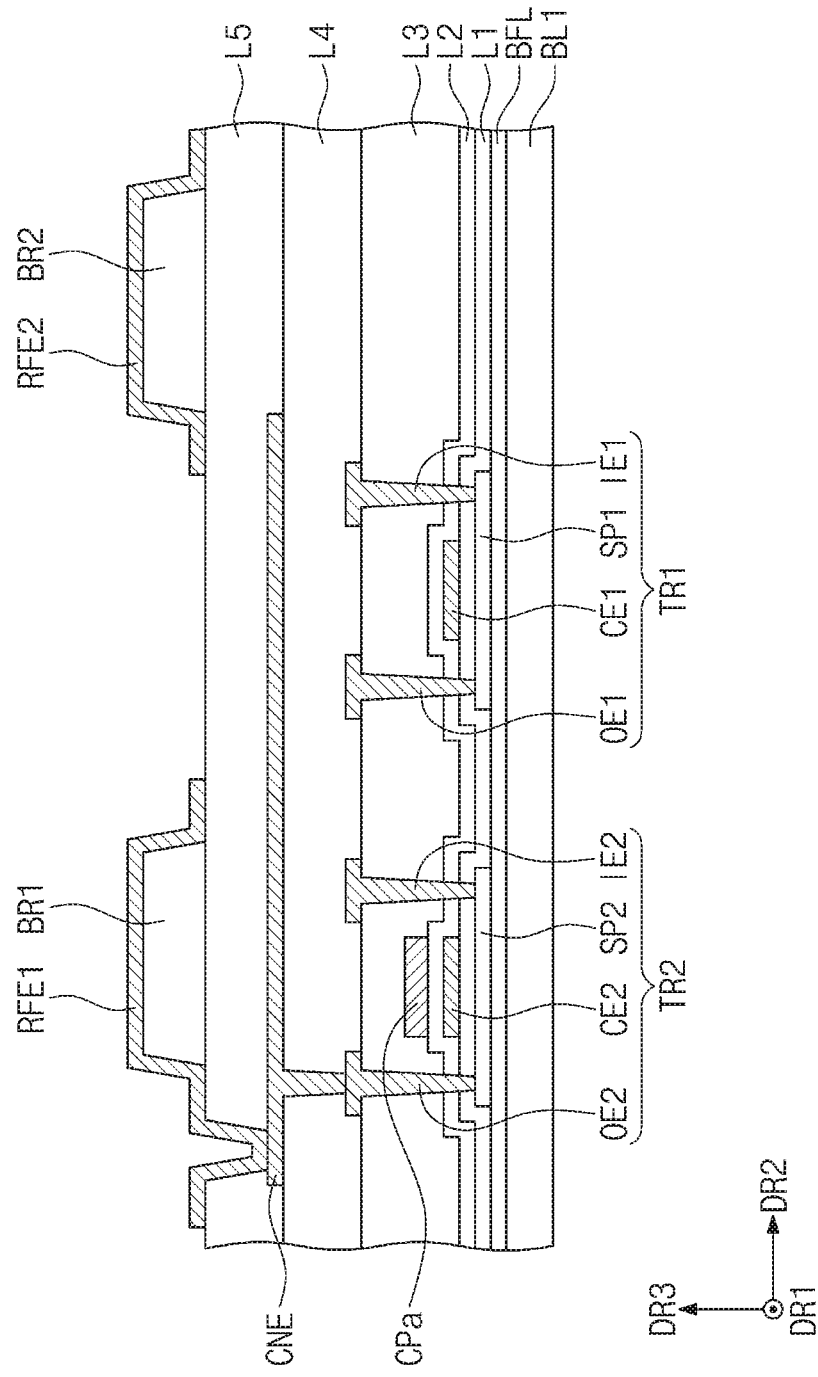

In relation to FIGS. 8C and 8D, a part of a first conductive layer CDL1, which is exposed by the first photoresist pattern OLP1, is removed. For example, a portion of the first conductive layer CDL1 may be wet-etched and removed.

By removing the first conductive layer CDL1, the first reflective electrode RFE1 and the second reflective electrode RFE2 are formed. After the first reflective electrode RFE1 and the second reflective electrode RFE2 are formed, the first photoresist pattern OLP1 is removed.

Figure 8E:
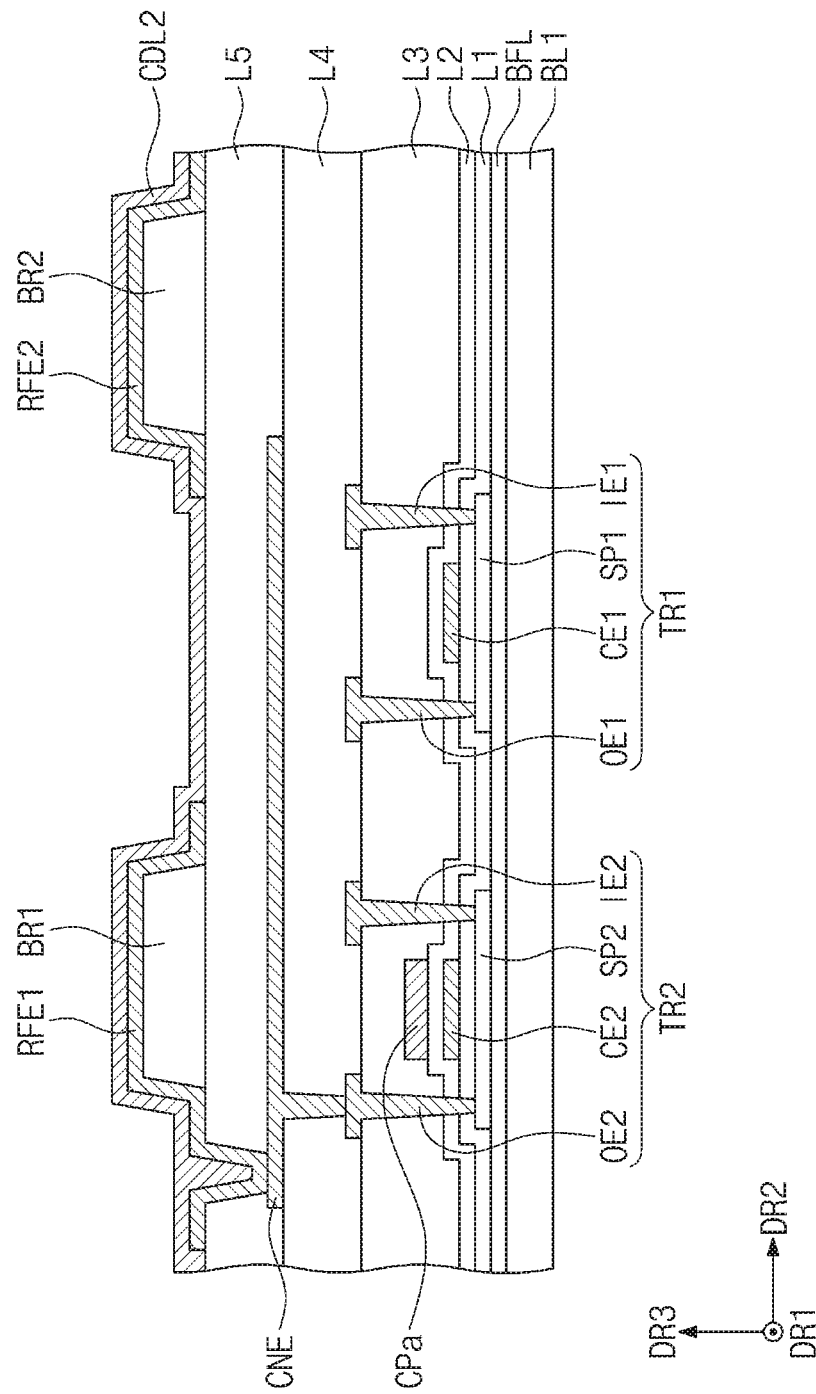

In relation to FIG. 8E, a second conductive layer CDL2 configured to cover the first reflective electrode RFE1 and the second reflective electrode RFE2 is formed. The second conductive layer CDL2 may include a conductive material which has a good selectivity to the first reflective electrode RFE1 and the second reflective electrode RFE2, for example, at least one among indium zinc oxide (IZO), indium tin oxide (ITO), indium gallium oxide (IGO), indium zinc gallium oxide (IGZO), and a mixture/a compound thereof.

Figure 8F:
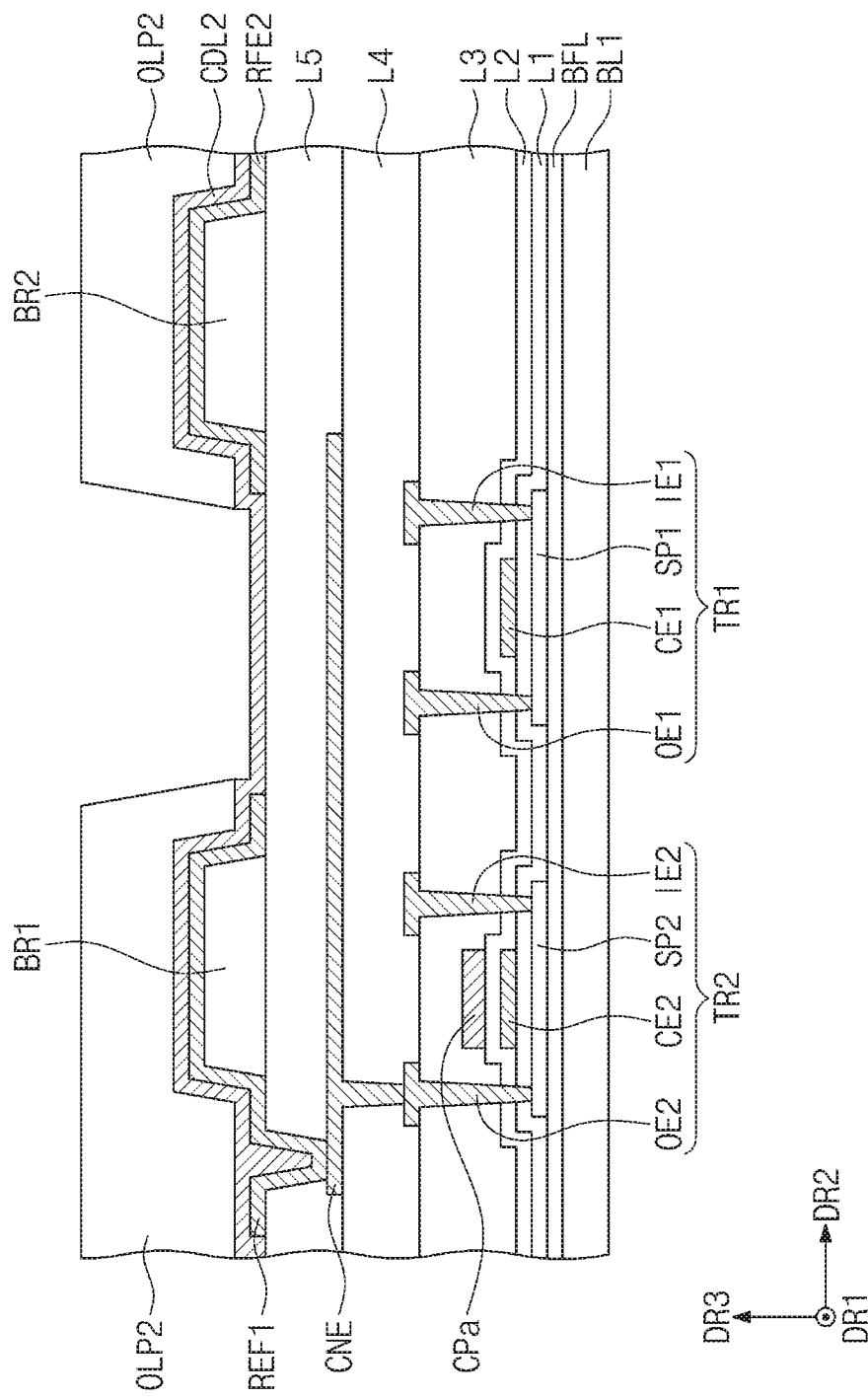
Figure 8G:
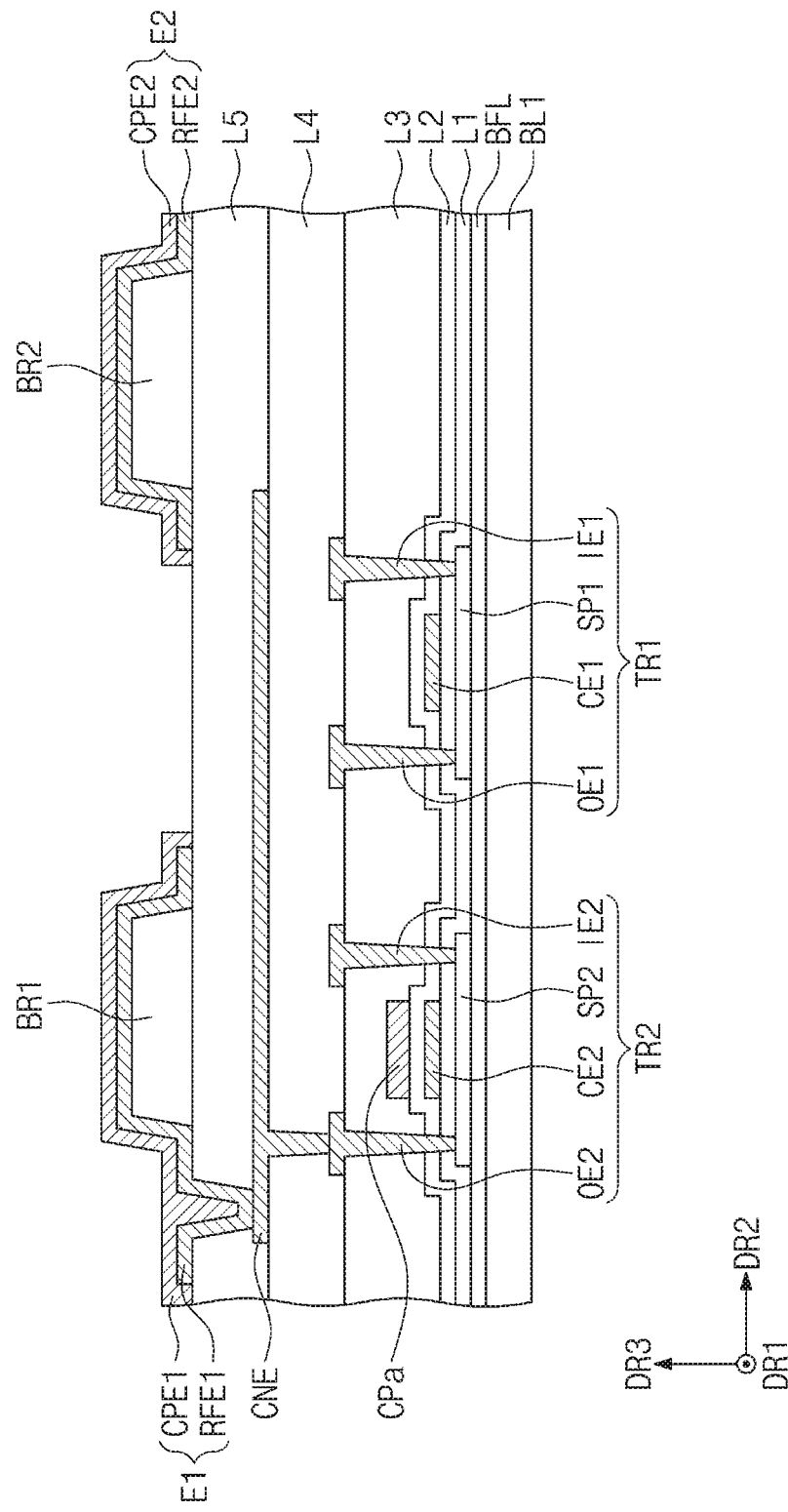

In relation to FIGS. 8F and 8G, the second photoresist pattern OLP2 is formed on the second conductive layer CDL2. The second photoresist pattern OLP2 may be provided after forming a positive photoresist layer or a negative photoresist layer and then patterning the same. For example, the patterning process may include a photo lithography process.

A portion of the second conductive layer CDL2 exposed by the second photoresist pattern OLP2 is removed. For example, the portion of the second conductive layer CDL2 may be wet-etched or dry-etched and removed. By removing the portion of the second conductive layer CDL2, the first capping electrode CPE1 and the second capping electrode CPE2 are formed.

Figure 8H:
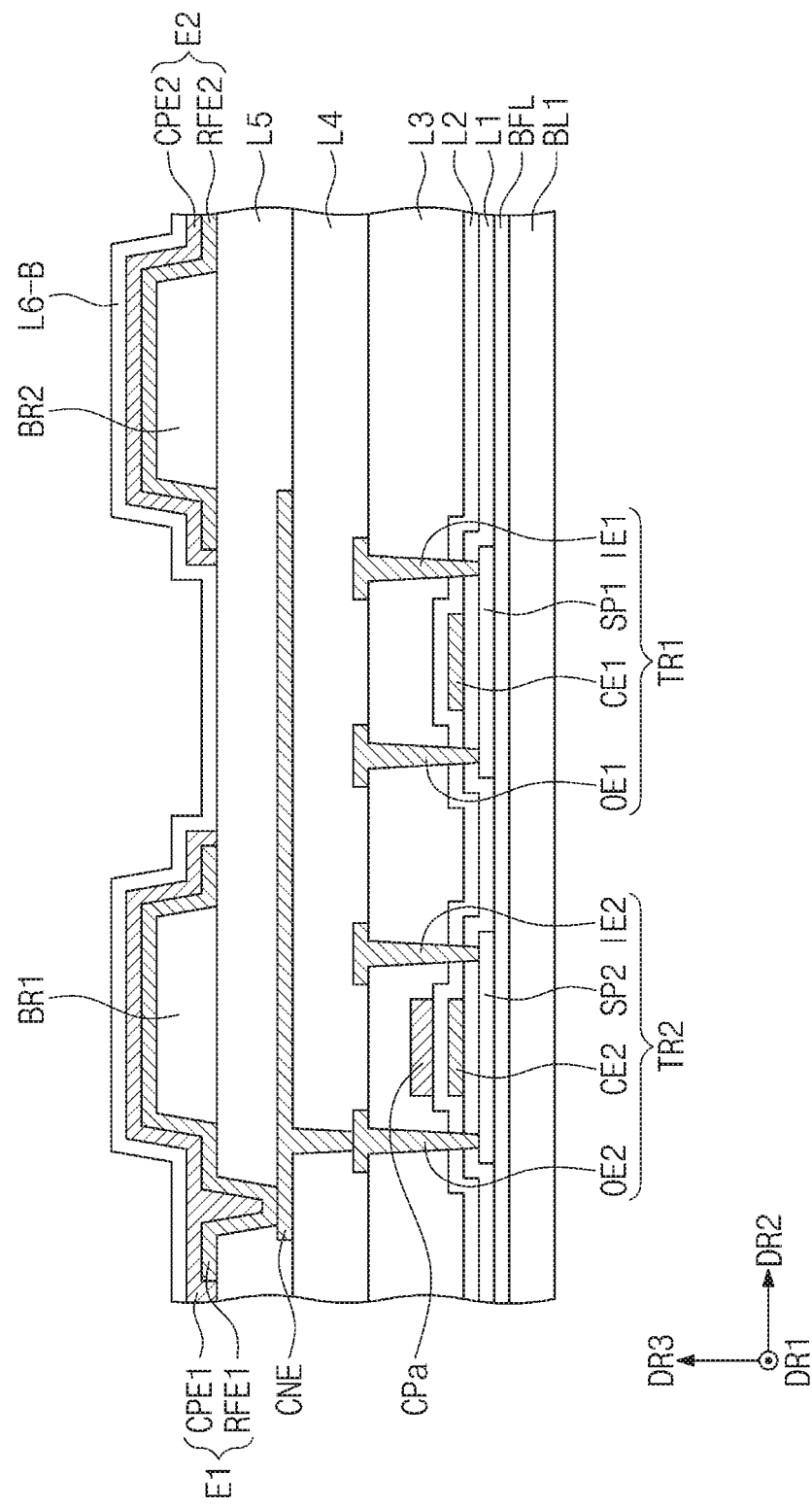

In relation to FIG. 8H, an insulation material layer L6-B is formed to cover the first electrode E1, the second electrode E2, and the fifth insulation layer L5. The insulation material layer L6-B may include an organic material. For example, the insulation material layer L6-B may be formed of a polyimide-based material.

Figure 8I:
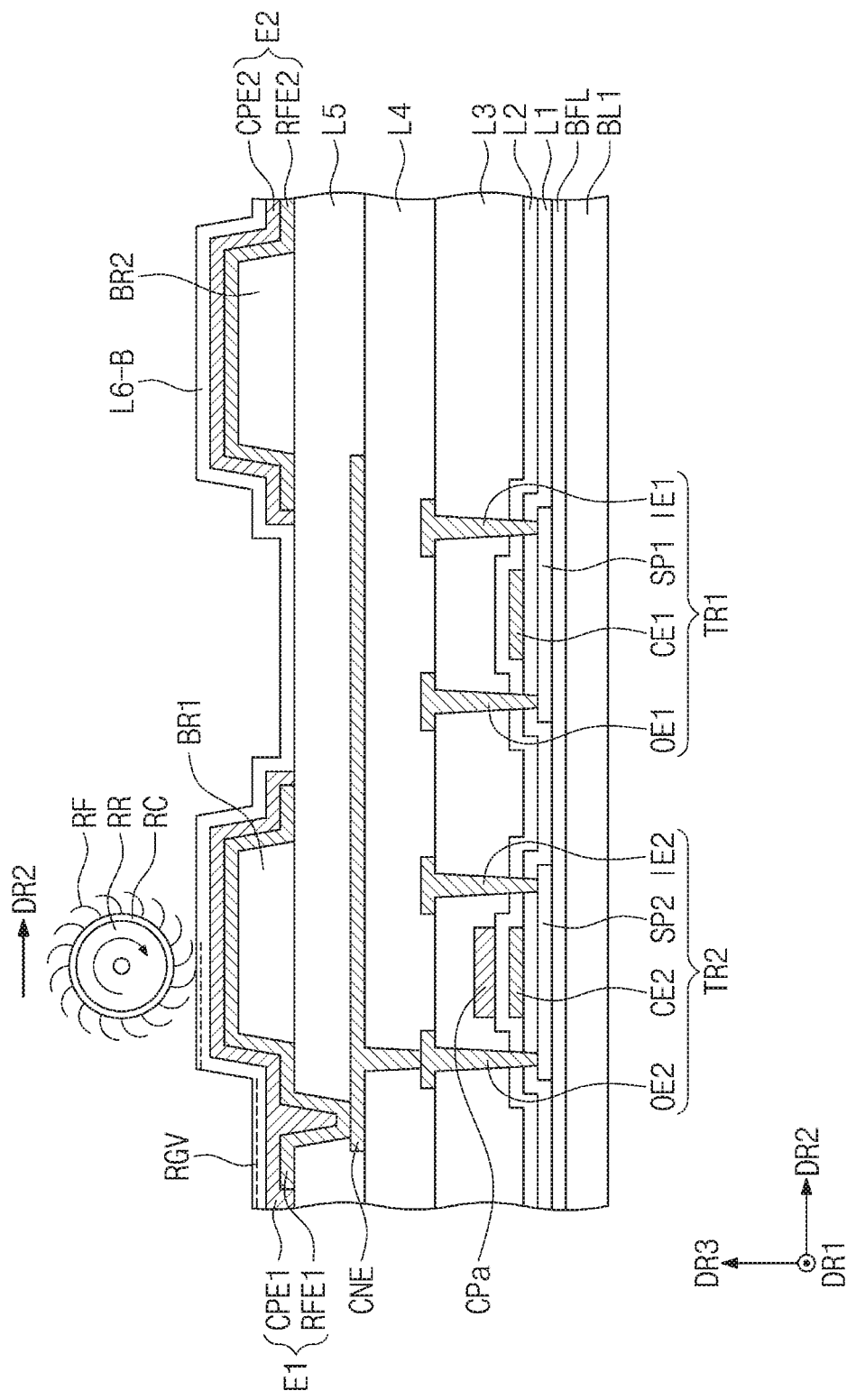

In relation to FIG. 8I, a rubbing roller RR configured to rub the insulation material layer L6-B may be disposed on the top portion of the insulation material layer L6-B. The rubbing roller RR rolls and moves in the second direction DR2. The rubbing roller RR moves in the second direction DR2 according to the exemplary embodiment, the inventive concept is not limited thereto, and the first base layer BL1 may move in the opposite direction to the second direction DR2.

A rubbing cloth RC may be wound around the rubbing roller, and rubbing files RF may be arrayed in a constant interval on the rubbing cloth RC. The thickness of the rubbing files RF may be differently set according to the size of the light emitting element ED, and in particular, according to the width W2 (refer to FIG. 6) of the light emitting element ED in the first direction DR1.

The rubbing groove RGV is formed on the top surface of the insulation material layer L6-B rubbed by the rubbing roller RR. Since the rubbing roller RR moves in the second direction DR2, the rubbing groove RGV may be formed to be extended in the second direction DR2.

Figure 8J:
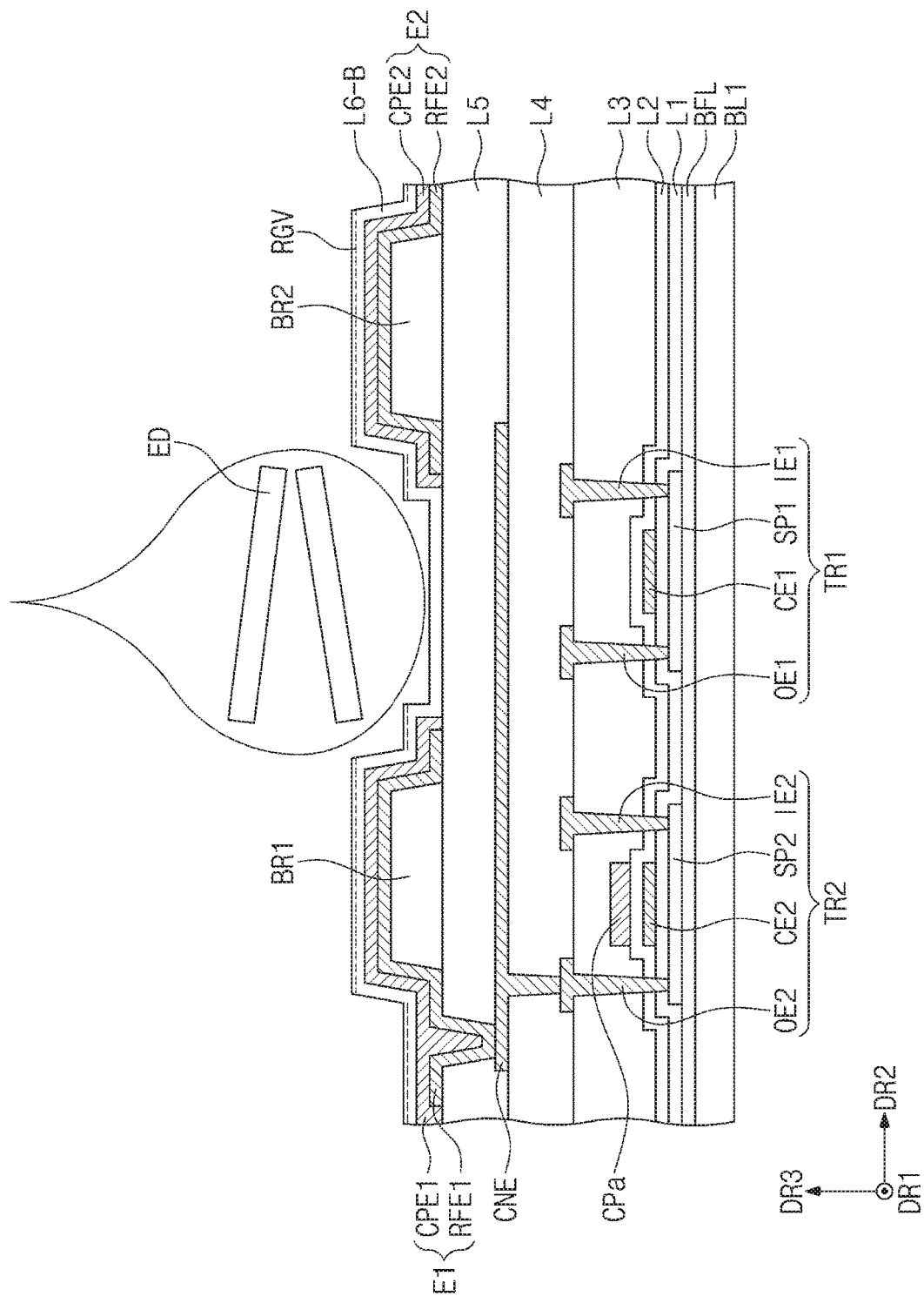

As shown in FIG. 8J, when the rubbing process is completed and the rubbing groove RGV is formed in the insulation material layer L6-B, a solvent such as an ink or a paste including the light emitting element ED is provided on the insulation material layer L6-B between the first and second barriers BR1 and BR2. The solvent may be a material that may evaporate at room temperature or by heat. An electric field is formed between the first electrode E1 and the second electrode E2 by applying power to the first electrode E1 and the second electrode E2. A dipole is induced to the light emitting element ED by the electrical field, and the light emitting element ED may be aligned between the first electrode E1 and the second electrode E2 by a dielectrophoretic force. When the first electrode E1 and the second electrode E2 are short-circuited, the electrical field may not be properly formed. When the electrical field is not properly formed, the light emitting element ED may not be properly aligned.

According to an embodiment of the inventive concept, light emitting elements ED may be more easily aligned between the first and second electrodes E1 and E2 by the rubbing groove RGV formed on the insulation material layer L6-B, and may be properly aligned in the second direction DR2 along the extension direction of the rubbing groove RGV. Accordingly, the reliability of alignment of the light emitting elements ED may be improved.

Although not shown in the drawing, the sixth insulation layer L6 is formed by patterning the insulation material layer L6-B. And then, the second connection electrode CNE2, the seventh insulation layer L7, the first connection electrode CNE1 and the eighth insulation layer L8 may be sequentially formed.

According to the present disclosure, a rubbing groove is formed on an insulation layer provided between at least first and second barriers, and accordingly, a light emitting element disposed between the first and second barriers may be aligned in an extension direction of the rubbing groove.

Therefore, the alignment of the light emitting element may be more easily performed, and as a result, the reliability of the display device may be improved.

While this inventive concept has been described with reference to exemplary embodiments thereof, it will be clear to those of ordinary skill in the art to which the inventive concept pertains that various changes and modifications may be made to the described embodiments without departing from the spirit and technical area of the inventive concept as defined in the appended claims and their equivalents. Thus, the scope of the inventive concept shall not be restricted or limited by the foregoing description, but be determined by the broadest permissible interpretation of the following claims.

What is claimed is:

1. A display device comprising:
   a pixel circuit;
   a first insulation layer covering the pixel circuit;
   a first barrier disposed on the first insulation layer and extending in a first direction;
   a second barrier extending in the first direction and spaced apart from the first barrier in a second direction substantially perpendicular to the first direction;
   a first electrode disposed on the first barrier and electrically connected to the pixel circuit;
   a second electrode disposed on the second barrier and separated from the first electrode;
   a second insulation layer disposed on the first electrode and the second electrode with a rubbing groove provided therein in the second direction; and
   a light emitting element aligned along the rubbing groove on the second insulation layer and electrically connected to the first electrode and the second electrode and disposed between the first barrier and the second barrier,
   wherein the second insulation layer is disposed on the first electrode, the first insulation layer, and the second electrode at least between the first and second barriers.

2. The display device of claim 1, wherein a width of the light emitting element is smaller than or equal to a width of the rubbing groove in the first direction.

3. The display device of claim 1, wherein a distance between the first barrier and the second barrier is larger than a distance between the first electrode and the second electrode in the second direction.

4. The display device of claim 3, wherein a distance between the first electrode and the second electrode in the second direction is smaller than a length of the light emitting element in the second direction.

5. The display device of claim 1, further comprising:
   a first connection electrode electrically connecting the first electrode and the light emitting element; and
   a second connection electrode electrically connecting the second electrode and the light emitting element.

6. A display device comprising:
   a pixel circuit;
   a first insulation layer covering the pixel circuit;
   a first barrier disposed on the first insulation layer and extending in a first direction;
   a second barrier extending in the first direction and spaced apart from the first barrier in a second direction substantially perpendicular to the first direction;
   a first electrode disposed on the first barrier and electrically connected to the pixel circuit;
   a second electrode disposed on the second barrier and separated from the first electrode;

a second insulation layer disposed on the first electrode and the second electrode with a rubbing groove provided therein in the second direction; and
a light emitting element aligned along the rubbing groove on the second insulation layer, electrically connected to the first electrode and the second electrode, and disposed between the first barrier and the second barrier,
wherein the second insulation layer includes polyimide-based material.

7. The display device of claim 6, wherein a width of the light emitting element is smaller than or equal to a width of the rubbing groove in the first direction.

8. The display device of claim 6, wherein a distance between the first barrier and the second barrier is larger than a distance between the first electrode and the second electrode in the second direction.

9. The display device of claim 8, wherein a distance between the first electrode and the second electrode in the second direction is smaller than a length of the light emitting element in the second direction.

10. The display device of claim 9, wherein the second insulation layer is disposed on the first electrode, the first insulation layer, and the second electrode at least between the first and second barriers.

11. The display device of claim 6, further comprising:
a first connection electrode electrically connecting the first electrode and the light emitting element; and
a second connection electrode electrically connecting the second electrode and the light emitting element.

12. A display device comprising:
a pixel circuit;
a first insulation layer covering the pixel circuit;
a first barrier disposed on the first insulation layer and extending in a first direction;
a second barrier extending in the first direction and spaced apart from the first barrier in a second direction substantially perpendicular to the first direction;
a first electrode disposed on the first barrier and electrically connected to the pixel circuit;
a second electrode disposed on the second barrier and separated from the first electrode;
a second insulation layer disposed on the first electrode and the second electrode with a rubbing groove provided therein in the second direction; and
a light emitting element aligned along the rubbing groove on the second insulation layer, electrically connected to the first electrode and the second electrode and disposed between the first barrier and the second barrier,
wherein the first electrode comprises a first reflective electrode electrically connected to the pixel circuit and comprising a first reflective material, and a first capping electrode covering the first reflective electrode, and
wherein the second electrode comprises a second reflective electrode configured to receive a power supply voltage and comprising a reflective material, and a second capping electrode covering the second reflective electrode.

13. The display device of claim 12, wherein a width of the light emitting element is smaller than or equal to a width of the rubbing groove in the first direction.

14. The display device of claim 12, wherein a distance between the first barrier and the second barrier is larger than a distance between the first electrode and the second electrode in the second direction.

15. The display device of claim 14, wherein a distance between the first electrode and the second electrode in the second direction is smaller than a length of the light emitting element in the second direction.

16. The display device of claim 15, wherein the second insulation layer is disposed on the first electrode, the first insulation layer, and the second electrode at least between the first and second barriers.

17. The display device of claim 12, further comprising:
a first connection electrode electrically connecting the first electrode and the light emitting element; and
a second connection electrode electrically connecting the second electrode and the light emitting element.

18. A display device comprising:
a pixel circuit;
a first insulation layer covering the pixel circuit;
a first barrier disposed on the first insulation layer and extending in a first direction;
a second barrier extending in the first direction and spaced apart from the first barrier in a second direction substantially perpendicular to the first direction;
a first electrode disposed on the first barrier and electrically connected to the pixel circuit;
a second electrode disposed on the second barrier and separated from the first electrode;
a second insulation layer disposed on the first electrode and the second electrode with a rubbing groove provided therein in the second direction; and
a light emitting element aligned along the rubbing groove on the second insulation layer, electrically connected to the first electrode and the second electrode, and disposed between the first barrier and the second barrier,
wherein the second insulation layer includes a first area, a second area, and a groove area,
wherein one end of the light emitting element contacts the second insulation layer in the first area, and another end of the light emitting element contacts the second insulation layer in the second area, and
wherein a gap is provided between the light emitting element and the second insulation layer in the groove area.

* * * * *